United States Patent
Yu et al.

(10) Patent No.: US 7,544,982 B2
(45) Date of Patent: Jun. 9, 2009

(54) IMAGE SENSOR DEVICE SUITABLE FOR USE WITH LOGIC-EMBEDDED CIS CHIPS AND METHODS FOR MAKING THE SAME

(75) Inventors: Chung-Yi Yu, Hsin-Chu (TW); Chia-Shiung Tsai, Hsin-Chu (TW); Shih-Chi Fu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 11/542,064

(22) Filed: Oct. 3, 2006

(65) Prior Publication Data

US 2008/0087921 A1     Apr. 17, 2008

(51) Int. Cl.
*H01L 31/062* (2006.01)
(52) U.S. Cl. ..................... 257/294; 257/432
(58) Field of Classification Search .......... 257/294, 257/432, 758
See application file for complete search history.

(56) References Cited

U.S. PATENT DOCUMENTS

| | | | |
|---|---|---|---|
| 6,301,051 B1 | 10/2001 | Sankur | |
| 6,521,523 B2 * | 2/2003 | Lee et al. | 438/633 |
| 6,577,342 B1 | 6/2003 | Wester | |
| 6,583,438 B1 | 6/2003 | Uchida | |
| 6,587,147 B1 | 7/2003 | Li | |
| 6,624,404 B2 | 9/2003 | Lee et al. | |
| 6,639,726 B1 | 10/2003 | Campbell | |
| 6,646,808 B2 | 11/2003 | Li | |
| 6,665,014 B1 | 12/2003 | Assadi et al. | |
| 6,736,626 B1 | 5/2004 | Lienau | |
| 6,821,810 B1 | 11/2004 | Hsiao et al. | |
| 6,861,686 B2 | 3/2005 | Lee et al. | |
| 6,977,218 B2 * | 12/2005 | Yu et al. | 438/633 |
| 7,064,405 B2 | 6/2006 | Kondo et al. | |
| 7,078,746 B2 * | 7/2006 | Hong | 257/222 |
| 7,084,056 B2 * | 8/2006 | Won | 438/627 |
| 7,291,826 B2 * | 11/2007 | Vaillant | 250/214.1 |
| 2005/0001318 A1 | 1/2005 | Won | |
| 2006/0113622 A1 | 6/2006 | Adkisson et al. | |
| 2006/0141653 A1 | 6/2006 | Choi | |

* cited by examiner

*Primary Examiner*—Mark Prenty
(74) *Attorney, Agent, or Firm*—Slater & Matsil, L.L.P.

(57) ABSTRACT

An image sensor device is provided. A substrate has a photosensor region formed therein and/or thereon. An interconnection structure is formed over the substrate, and includes metal lines formed in inter-metal dielectric (IMD) layers. At least one IMD-level micro-lens is/are formed in at least one of the IMD layers over the photosensor region. Preferably, barrier layers are located between the IMD layers. Preferably, each of the barrier layers at each level has a net thickness limited to 100 angstroms or less at locations over the photosensor region, except at locations where the IMD-level micro-lenses are located. The IMD-level micro-lenses and the etch stop layers preferably have a refractive index greater than that of the IMD layers. A cap layer is preferably formed on the metal lines, especially when the metal lines include copper. An upper-level micro-lens may be located on a level that is above the interconnection structure.

22 Claims, 21 Drawing Sheets ural patents# IMAGE SENSOR DEVICE SUITABLE FOR USE WITH LOGIC-EMBEDDED CIS CHIPS AND METHODS FOR MAKING THE SAME

TECHNICAL FIELD

The present invention generally relates to solid state imaging devices. In one aspect it relates more particularly to an image sensor device with micro-lenses that is suitable for use with logic-embedded chips or system-on-chip applications.

BACKGROUND

Solid state imaging devices typically include a photosensor such as a photodiode formed in or on a substrate, a color filter formed over the photosensitive device and a microlens array formed over the color filter. The photosensor may be a photodiode, a CMOS (complimentary metal oxide semiconductor) sensor or a charge-coupled device (CCD), for example. N+ type photosensors (NPS's) are commonly used. Between the photosensor and the color filter there is generally a relatively thick inter-metal dielectric (IMD) that accommodates multiple levels of metallization used as an interconnection medium in the peripheral circuits of the solid state imaging device.

It is clearly desirable to maximize the sensitivity of the imaging device, i.e., the amount of light that reaches the photosensors. One shortcoming of imaging devices is that the sensitivity of the photosensor is proportional to the fill factor, which is defined as the ratio of the area of the photosensor to that of the pixel area. The thick inter-metal dielectric makes it difficult to align the lens and photosensor and insure that the light, which passes through the lens, reaches the photosensor. The amount of light that is not directed to the photosensor increases with the increasing thickness of the IMD. Furthermore, the interconnect metal disposed within the IMD may reflect incident light further reducing the optical signal and therefore the sensitivity of the photosensor.

FIG. 1A shows an exemplary solid state imaging sensor device 20 and includes photosensors 22 formed in a substrate 24 according to the prior art. The imaging sensor device 20 also includes IMD layers 26 with several levels of metal interconnect lines 32. The metal lines 32 are located between the photosensors 22 leaving light pathways for light rays 28 to reach the photosensors 22. A passivation level 30 is located above the interconnection structure 34. The passivation level 30 may include a silicon nitride film and another dielectric layer, which may be formed by the chemical vapor deposition of a high density plasma, for example. The image sensor device also includes plain layer 35, color filter 36, microspacer 37, and upper-most micro-lenses 38 aligned over photosensors 22. Optional overcoat 39 covers upper-most micro-lenses 38 and may be formed of suitable materials such as acrylate, methacrylate, epoxy-acrylate, or polyimide, and may include a thickness of 0.3-3.0 μm, for example. Plain layer 35 may have a refractive index of 1.4-1.7, may be composed of acrylate, methacrylate, epoxy-acrylate, or polyimide, and may include a thickness of 0.3-3.0 μm, for example. Microspacer 37 may have a refractive index of 1.4-1.7, may be composed of acrylate, methacrylate, epoxy-acrylate, or polyimide, and include a thickness of 0.3-3.0 μm, for example. Color filter 36 may have a refractive index of 1.4-1.7, may be composed of acrylate, methacrylate or epoxy-acrylate, and indicates a thickness of 0.3-2.5 μm, in this example. It can be seen that the thickness 40 of interconnection structure 34 needed to accommodate the multiple layers of metal interconnects lines 32 positions the upper-most micro-lenses 38 distant from corresponding photosensors 22, potentially diminishing the amount of light 28 that reaches the photosensors 22.

FIG. 1B is an enlarged view of the interconnection structure 34 of FIG. 1A described above, showing more details. Copper is currently the metal of choice for metal lines 32. Using copper typically requires barrier layers. Also, when forming the metal lines 32 using a copper damascene or dual-damascene method, it is typically desirable to use barrier layers 42 for copper diffusion barrier. Also, it is now the preferred practice to use low-k dielectric materials for the IMD layers 26 and for the barrier layers 42 also present as an etch stop layer. As illustrated in FIG. 1B, typical barrier layers 42 are too thick, and part of the light (see e.g., the light ray 28 in FIG. 1B) is reflected by the barrier layers 42. And with the number of metallization lines 32 and levels increasing with the development of new chips (e.g., system-on-chip or SoC structures, logic-embedded or logic circuits on same chip as image sensor device), the ability of the light 28 to reach the photosensors 22 with sufficient energy is becoming incompatible with current designs for making image sensor devices. Furthermore, as the photosensors and micro-lenses continue to shrink to increase the number pixels per chip (for increased resolution for a given size chip), these problems become even more pronounced (because the photosensor areas 22 are shrinking also).

Hence, a need exists for an improved structure that increases the sensitivity of the imaging device by allowing more light to be received by the photosensors. Furthermore, there is a need for improved structures for image sensor devices that are compatible with thicker interconnection structures (more metallization levels) and compatible with shrinking pixel areas (greater number of pixels per square millimeter). Yet, it would be desirable to not depart too far from the current methods of manufacturing and current layout structures as well, for which the manufacturers already have much capital investment in tooling, intellectual property, design blocks, and employee training.

SUMMARY OF THE INVENTION

The problems and needs outlined above may be addressed by embodiments of the present invention. In accordance with one aspect of the present invention, an image sensor device is provided, which includes a photosensor region, an interconnection structure, and at least one IMD-level micro-lens. A substrate has the photosensor region formed therein and/or thereon. The interconnection structure is formed over the substrate. The interconnection structure includes metal lines formed in inter-metal dielectric (IMD) layers. The IMD-level micro-lens is formed in at least one of the IMD layers over the photosensor region. Preferably, barrier layers are located between the IMD layers. Each of the barrier layers at each level preferably has a net thickness limited to 100 angstroms or less at locations over the photosensor region, except at locations where the IMD-level micro-lenses are located.

This paragraph describes some variations for embodiments of the aspect of the present invention described in the immediately preceding paragraph. The IMD-level micro-lenses preferably have a refractive index greater than that of the IMD layers in which the IMD-level micro-lenses are formed. A cap layer is preferably formed on the metal lines, especially when the metal lines include copper. The cap layer may include any suitable cap layer material, such as conductive material, metal nitride, CoWP, CoWB, metal silicide, and combinations thereof, for example. The interconnection structure may have at least three levels of the metal lines. The barrier layers may include a material different from that of the IMD-level microlenses. An IMD-level micro-lens may be formed from a same material and a same initial layer as that of a barrier layer. An IMD-level micro-lens may include any suitable lens material, such as, a metal oxide, aluminum oxide, hafnium oxide, zirconium oxide, a nitrogen containing material, a carbon containing material, and combinations thereof, for example. The barrier layers may include any suitable barrier layer material, such as a metal oxide, aluminum oxide, hafnium oxide, zirconium oxide, a nitrogen containing material, a carbon containing material, and combinations thereof, for example. An IMD-level micro-lens may be located between the photosensor region and a color filter. An IMD-level micro-lens may have any suitable shape, such as a convex shape, a Fresnel lens shape, bi-convex shape, a plano-convex shape, a convex-up shape, a convex-down shape, and combinations thereof, for example. An upper-level micro-lens may be located over the photosensor region and located on a level that is above the interconnection structure. A color filter may be located over the photosensor region, and the upper-level micro-lens may be located between the color filter and an IMD-level micro-lens. A color filter may be located over the photosensor region, and may be located between an upper-level micro-lens and an IMD-level micro-lens. A system-on-chip semiconductor structure may include an image sensor device of the present invention, where the system-on-chip semiconductor structure includes a logic circuit electrically connected to at least part of the image sensor device.

In accordance with another aspect of the present invention, an image sensor device is provided, which includes a substrate, an interconnection structure, an upper-level micro-lens, and a cap layer. The substrate has a photosensor region formed therein and/or thereon. The interconnection structure is formed over the substrate. The interconnection structure includes metal lines formed in IMD layers. At least some of the metal lines include copper. The upper-level micro-lens is located over the photosensor region and located on a level that is above the interconnection structure. The cap layer is formed on the metal lines that include copper.

In accordance with yet another aspect of the present invention, an image sensor device is provided, which includes a photosensor region, an interconnection structure, at least one IMD-level micro-lens, barrier layers, and a cap layer. A substrate has the photosensor region formed therein and/or thereon. The interconnection structure is formed over the substrate. The interconnection structure includes metal lines formed in inter-metal dielectric (IMD) layers. At least some of the metal lines include copper. The at least one IMD-level micro-lens is/are formed in at least one of the IMD layers over the photosensor region. Each IMD-level micro-lens has a refractive index greater than that of the at least one of the IMD layers in which it is formed. The barrier layers are located between the IMD layers. Each of the barrier layers at each level has a net thickness limited to 100 angstroms or less at locations over the photosensor region, except at locations where the at least one IMD-level micro-lens is located. The cap layer is formed on the metal lines that include copper. The image sensor device may further include an upper-level micro-lens located over the photosensor region and located on a level that is above the interconnection structure (above or below a color filter, if any).

In accordance with yet another aspect of the present invention, an image sensor device is provided, which includes a photosensor region, an interconnection structure, an upper-level micro-lens, barrier layers, and a cap layer. A substrate has the photosensor region formed therein and/or thereon. The interconnection structure is formed over the substrate. The interconnection structure includes metal lines formed in IMD layers. At least some of the metal lines include copper. The upper-level micro-lens is located over the photosensor region and located on a level that is above the interconnection structure. The barrier layers are located between the IMD layers. Each of the barrier layers at each level has a net thickness limited to 100 angstroms or less at locations over the photosensor region (not considering the locations where a micro-lens may be). The cap layer is formed on the metal lines that include copper. The upper-level micro-lens may be located on a surface (upper-most), in a passivation layer, above a color filter, below a color filter, or appropriate combinations thereof. The image sensor device may further include at least one IMD-level micro-lens formed in at least one of the IMD layers over the photosensor region. In such case, the thickness of each of the barrier layers is limited to 100 angstroms or less at locations over the photosensor region, except at locations where any of the at least one IMD-level micro-lens is located.

In accordance with still another aspect of the present invention, a method of forming an image sensor device is provided. This method includes the following steps described in this paragraph. The order of the steps may vary, may be sequential, may overlap, may be in parallel, and combinations thereof, if not otherwise stated. A substrate with a photosensor region formed therein and/or thereon is provided. A first inter-metal dielectric (IMD) layer is formed over the substrate. A metal line is formed in the first IMD layer. An initial layer of barrier layer material is formed over the first IMD layer and over the metal line. A photoresist layer is patterned and etched to form a generally lens shaped portion of the photoresist layer on the initial layer of barrier layer material, over the photosensor region, and adjacent to the metal line. The initial layer of barrier layer material is etched, such that an IMD-level micro-lens is formed from the initial layer of barrier layer material directly under a location where the generally lens shaped portion of the photoresist layer was located during the etching of the initial layer of barrier layer material, and such that a barrier layer is formed from the initial layer of barrier layer material adjacent to the IMD-level micro-lens and over the metal line, wherein the barrier layer has a net thickness of 100 angstroms or less. A second IMD layer is formed over the IMD-level micro-lens and the barrier layer, wherein the barrier layer material has a greater refractive index than the dielectric material of the first and second IMD layers. The metal line may include copper, and in such case a cap layer is formed over the metal line prior to the forming of the initial layer of barrier layer material. The method may further include forming additional IMD layers, additional metal lines over the second IMD layer to form an interconnection structure, and forming an upper-most microlens located over the photosensor region and located on a level that is above the interconnection structure. The method may include forming a logic circuit that is electrically connected to at least part of the image sensor device, and forming additional IMD layers and additional metal lines over the second IMD layer to form an interconnection structure.

The foregoing outlines rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1A:
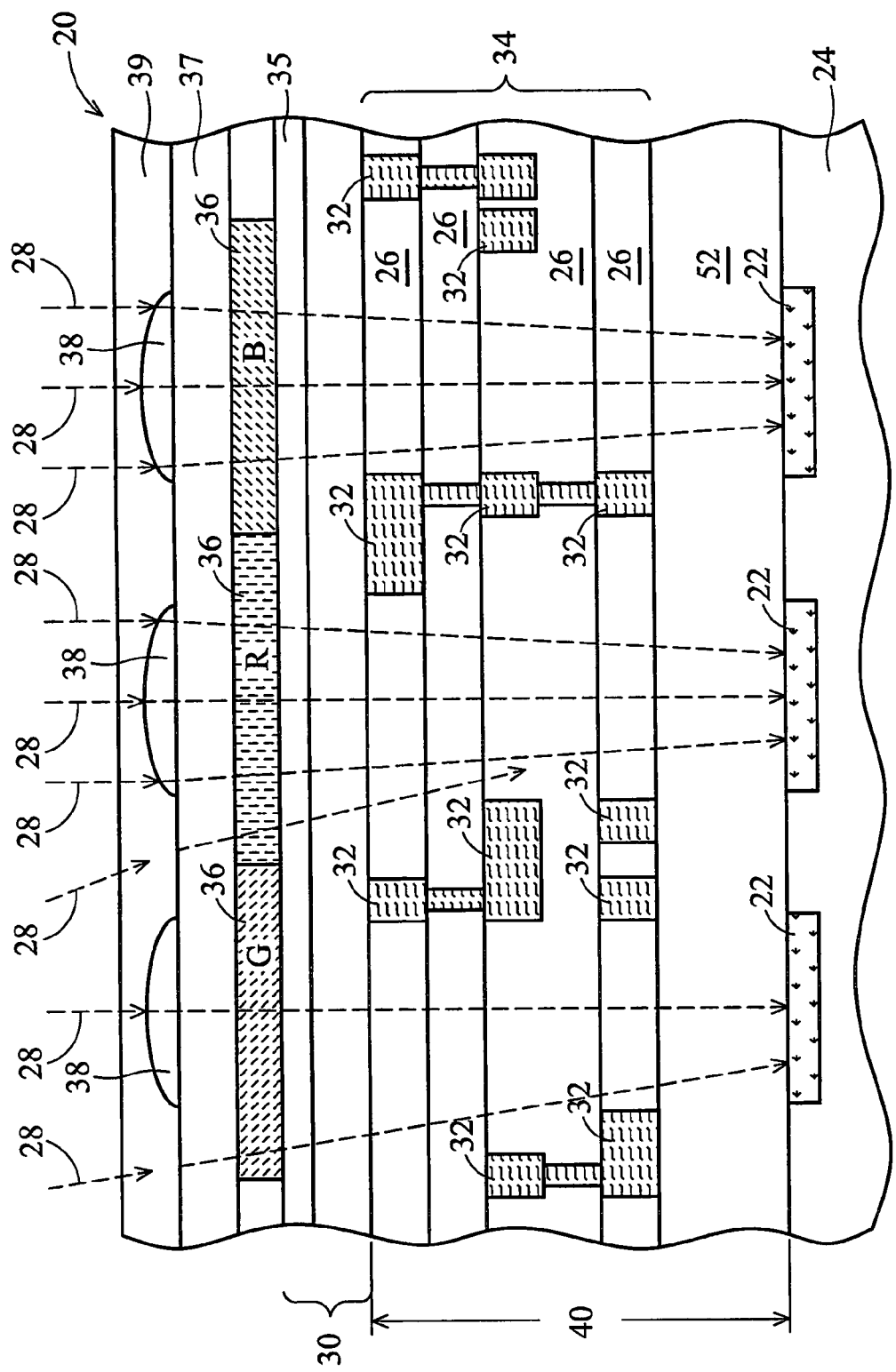
FIGS. 1A and 1B illustrate a conventional image sensor device of the prior art.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 1B:
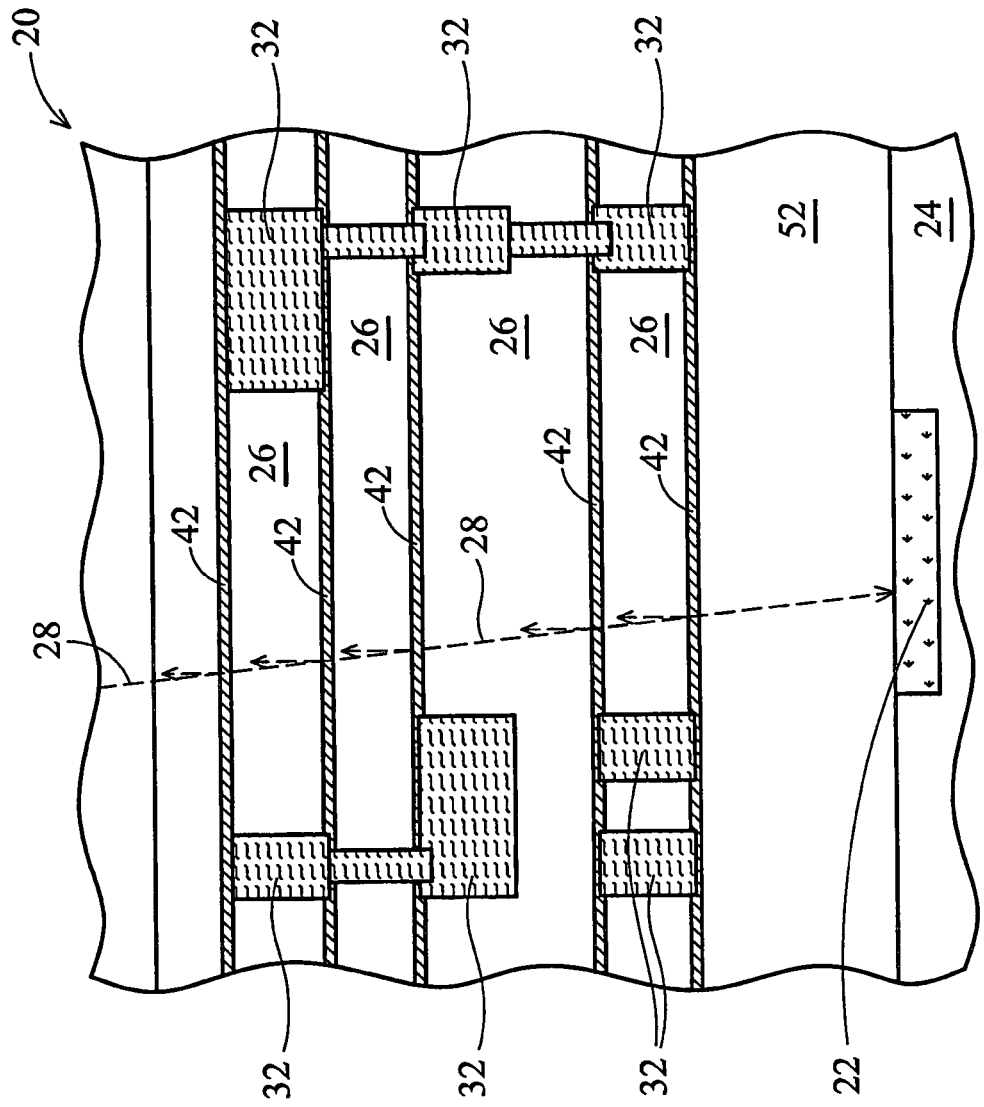

Generally, an embodiment of the present invention provides a structure for an image sensor device and methods of making the same. As discussed above, FIGS. 1A and 1B illustrate a conventional image sensor device 20. Next, several exemplary embodiments of the present invention will be described.

Figure 2:
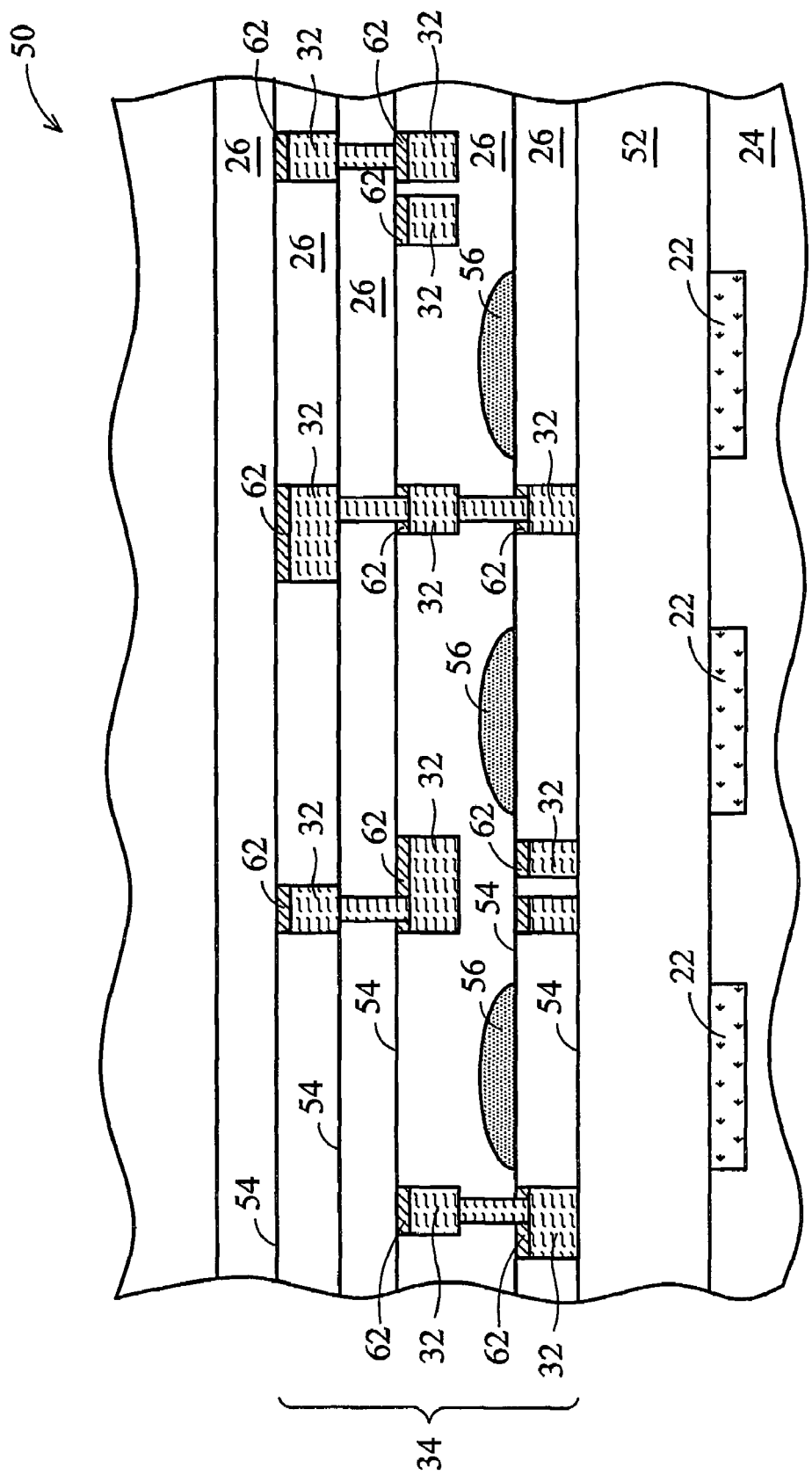
FIG. 2 is a cross-section view showing part of an image sensor device in accordance with a first illustrative embodiment of the present invention.

FIG. 2 is a cross-section view showing part of an image sensor device 50 in accordance with a first illustrative embodiment of the present invention. First, the components shown in FIG. 2 will be noted, and then each component will be discussed in greater detail. In FIG. 2, three photosensor regions 22 (among many, which may be formed in an array) are shown. The photosensor regions or photosensors 22 are formed in a substrate 24 in this example. An inter-level dielectric (ILD) layer 52 is formed over the substrate 24. An interconnect structure 34 is formed over the ILD layer 52. The interconnection structure 34 includes inter-metal dielectric (IMD) layers 26 and metal lines 32. Barrier layers 54 are formed between the IMD layers 26. In the first illustrative embodiment, IMD-level micro-lenses 56 are formed at a second metallization level of the interconnect structure 34, for example. The IMD-level micro-lenses 56 are formed over the photosensor regions 22 and between the metal lines 32.

Note that in FIGS. 2-6 and 13-18, the portions above the image sensor device 50, which may include color filters, other lenses, and passivation layers, are not shown to simplify the drawings. Also, other portions of the substrate 24 adjacent and below the photosensor regions 22 are not shown to simplify the drawings. The integrated circuit chip that includes an image sensor device 50 of an embodiment may include other circuits and structures not shown in FIGS. 2-6 and 13-18, as the image sensor device 50 of an embodiment may be incorporated in to many different chips (e.g., SoC, logic embedded chips) for many different applications currently known (e.g., cell phones, iPods, laptop computers) or later developed.

In an embodiment, the photosensor region 22 may be formed on the substrate, partially in the substrate, partially on the substrate, in the substrate, or combinations thereof. The photosensor region 22 is shown in a simplified manner in the figures. In an embodiment of the present invention, the photosensor region 22 may be any currently used or later developed photosensor or pixel region. Each photosensor region 22 is often referred to as a pixel. In a typical image sensor device, the pixels will have a square-grid-array lay out in a plan view. Any current or future developed lay out of the pixels in a plan view may be used for an embodiment of the present invention. The photosensor regions 22 may include any suitable photosensors, including (but not necessarily limited to): CMOS image sensors (CIS), charge-coupled device (CCD), three transistor CIS (3T), four transistor CIS (4T), photodiodes, N+ type photosensors (NPS), and suitable combinations thereof, for example.

The ILD layer 52 of an embodiment may be any suitable dielectric material (any number of layers and/or levels), including (but not limited to): an oxide, silicon oxide, a low-k dielectric material, BPSG, TEOS, SiOC, and combinations thereof, for example. The IMD layers 26 of an embodiment may include any suitable dielectric material (any number of layers and/or levels), including (but not limited to): an oxide, silicon oxide, a low-k dielectric material, FSG, PSG, Black Diamond, TEOS, SiOC, and combinations thereof, for example. The metal lines 32 of the interconnect structure 34 of an embodiment may be made from any suitable conductive material (may be all or part metal) (any number material combinations) (any number of layers and/or levels), including (but not necessarily limited to): metal, doped semiconductor, doped polysilicon, copper, aluminum, AlCu, tungsten, gold, silver, and combinations thereof, for example. The barrier layers 54 of an embodiment may be made from any suitable barrier material, including (but not limited to): silicon carbide, silicon nitride, $Al_2O_3$, $ZrO_2$, hafnium oxide, a nitrogen containing material, a carbon containing material, and combinations thereof, for example. The micro-lenses 38, 56, 58 of an embodiment may be made from any suitable lenses material, including (but not limited to): silicon carbide, silicon nitride, $Al_2O_3$, $ZrO_2$, hafnium oxide, a nitrogen containing material, a carbon containing material, and combinations thereof, for example.

Back to FIG. 2 and the first embodiment, the IMD-level micro-lenses are formed from a same material and a same initial layer as the barrier layer at that level. A method of forming IMD-level micro-lenses 56 this way is described in more detail below with respect to FIGS. 8-9.

In the first embodiment, and as is preferred for other embodiments of the present invention, barrier layer 54 at each level has a net thickness limited to 100 angstroms or less at locations over the photosensor region 22, except of course at locations where the IMD-level micro-lenses 56 are located. By keeping the net thickness of the barrier layer 54 (regardless of how many layers that each barrier layer has at a given level) at or below 100 angstroms, each barrier layer 54 provides greater transmission and less reflection of the light passing there through above the photosensor regions 22. Experimentation has shown that a net barrier layer thickness of 100 angstroms or less has no impact the quantum efficiency of the light passing through it. This is described in more detail with reference to FIGS. 19A and 19B below. By limiting the net thickness of each barrier layer 54, the structures of the image sensor devices 50 of the present invention may be compatible with chips having three or more metallization levels (e.g., system-on-chip applications, logic-embedded CIS devices). There is a current trend for the number of metallization levels for an interconnect structure 34 to increase, especially as image sensor devices 50 are integrated into complex chips having logic and/or other devices or a whole system on one chip.

Also in the first embodiment, and as is preferred for other embodiments of the present invention, the barrier layer 54 at each level has a refractive index greater than that of the adjacent IMD layers 26. The IMD-level micro-lenses 56 of the first embodiment, and as is preferred for other embodiments of the present invention, also have a refractive index greater than that of the IMD layers 26 they are embedded in.

The metal lines 32 of the first embodiment are preferably copper formed using a damascene (or dual damascene) process. Each copper metal line 32 of the interconnect structure 34 shown in FIG. 2 has a cap layer 62 over it. The cap layers 62 over the metal lines 32 provides a diffusion barrier for the copper lines. Typically, the holes and trenches formed in the IMD layer 26 for the metal lines 32 and via plugs are lined with a diffusion barrier layer (not shown to simplify drawings) as well. The cap layer 62 is patterned and etched so that it is located over the metal lines 32 but not elsewhere (i.e., not over the photosensor regions 22 and not causing shorts between lines 32). The cap layer 62 of an embodiment may include any suitable cap layer material (one layer or multiple stacked layers), including (but not limited to): CoWP, CoWB, metal silicide, metal nitride, conductive diffusion barrier material, and combinations thereof, for example. The cap layer 62 is an optional feature for an embodiment of the present invention, as some embodiments may not need it. While using the cap layer 62 and the IMD-level micro-lenses 56 for the first embodiment of the present invention, the barrier layer 54 is an optional feature since the cap layer 62 is capable of presenting as a copper diffusion barrier. In other embodiments, while using the cap layer 62 and the IMD-level micro-lenses 56, there is no barrier layer 54 at locations over the photosensor region 22. In another embodiment, while using the cap layer 62 and the IMD-level micro-lenses 56, barrier layer 54 at each level has a net thickness limited to 100 angstroms or less at locations over the photosensor region 22, except of course at locations where the IMD-level micro-lenses 56 are located.

Figure 3:
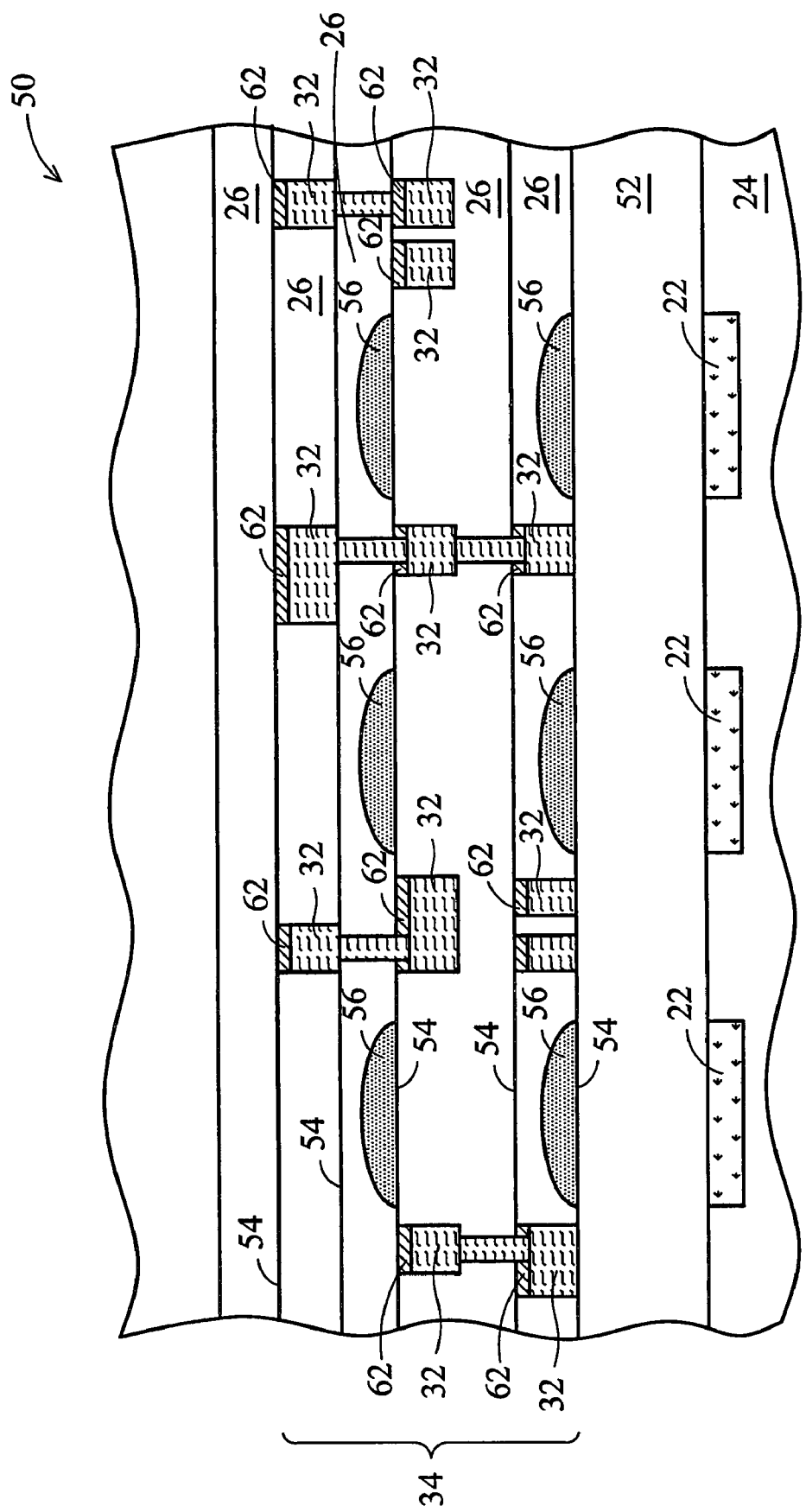
FIG. 3 is a cross-section view showing part of an image sensor device in accordance with a second illustrative embodiment of the present invention.

FIG. 3 is a cross-section view showing part of an image sensor device 50 in accordance with a second illustrative embodiment of the present invention. The second illustrative embodiment is essentially the same as the first embodiment of FIG. 2, except that the second embodiment has multiple levels of IMD-level micro-lenses 56. This illustrates that there may be any number of levels of IMD-level micro-lenses 56 in an embodiment.

Figure 4:
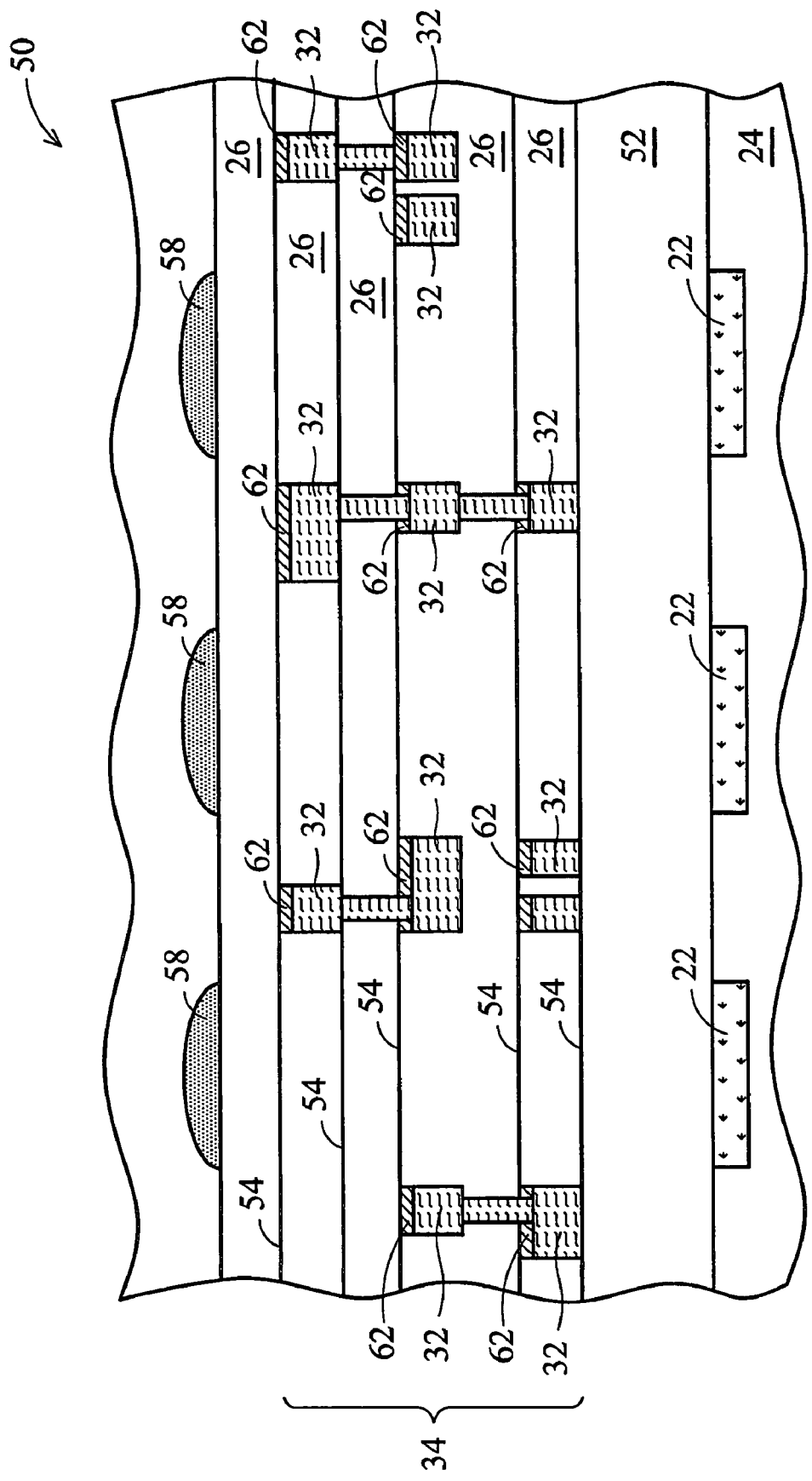
FIG. 4 is a cross-section view showing part of an image sensor device in accordance with a third illustrative embodiment of the present invention.

FIG. 4 is a cross-section view showing part of an image sensor device 50 in accordance with a third illustrative embodiment of the present invention. In the third embodiment, micro-lenses 58 are formed on a level that is above the interconnection structure 34 and above the photosensor regions 22 (see FIG. 4). In the third embodiment, the micro-lenses 58 may be located on a level that is between the interconnection structure 34 and color filters (color filters are not shown in FIG. 4, but see color filters 36 in FIGS. 1A and 6 for example). Furthermore, although not shown in FIGS. 2-5, any embodiment of the present invention may include color filters 36 and/or upper-most micro-lenses 38 as shown in the upper levels in FIGS. 1A and 6, for example. The micro-lenses 58 of FIG. 4 may be formed in an IMD layer, a passivation layer, or any other layer on or above the interconnection structure 34.

Figure 5:
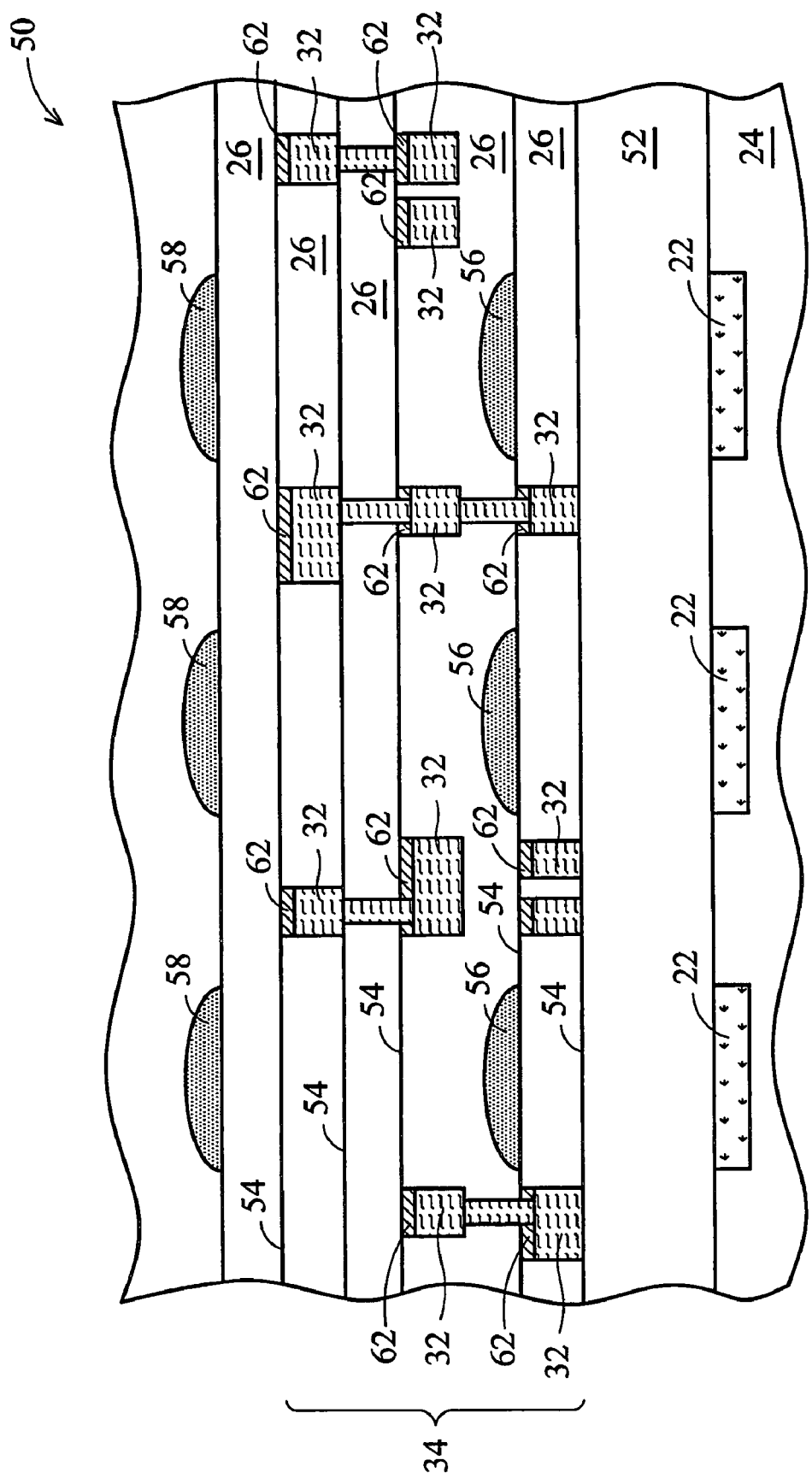
FIG. 5 is a cross-section view showing part of an image sensor device in accordance with a fourth illustrative embodiment of the present invention.

FIG. 5 is a cross-section view showing part of an image sensor device 50 in accordance with a fourth illustrative embodiment of the present invention. The fourth embodiment is essentially a combination of the first (or second) embodiment and the third embodiment, in that the image sensor device 50 has IMD-level micro-lenses 56 and micro-lenses 58 on a level that is above the interconnection structure 34.

Figure 6:
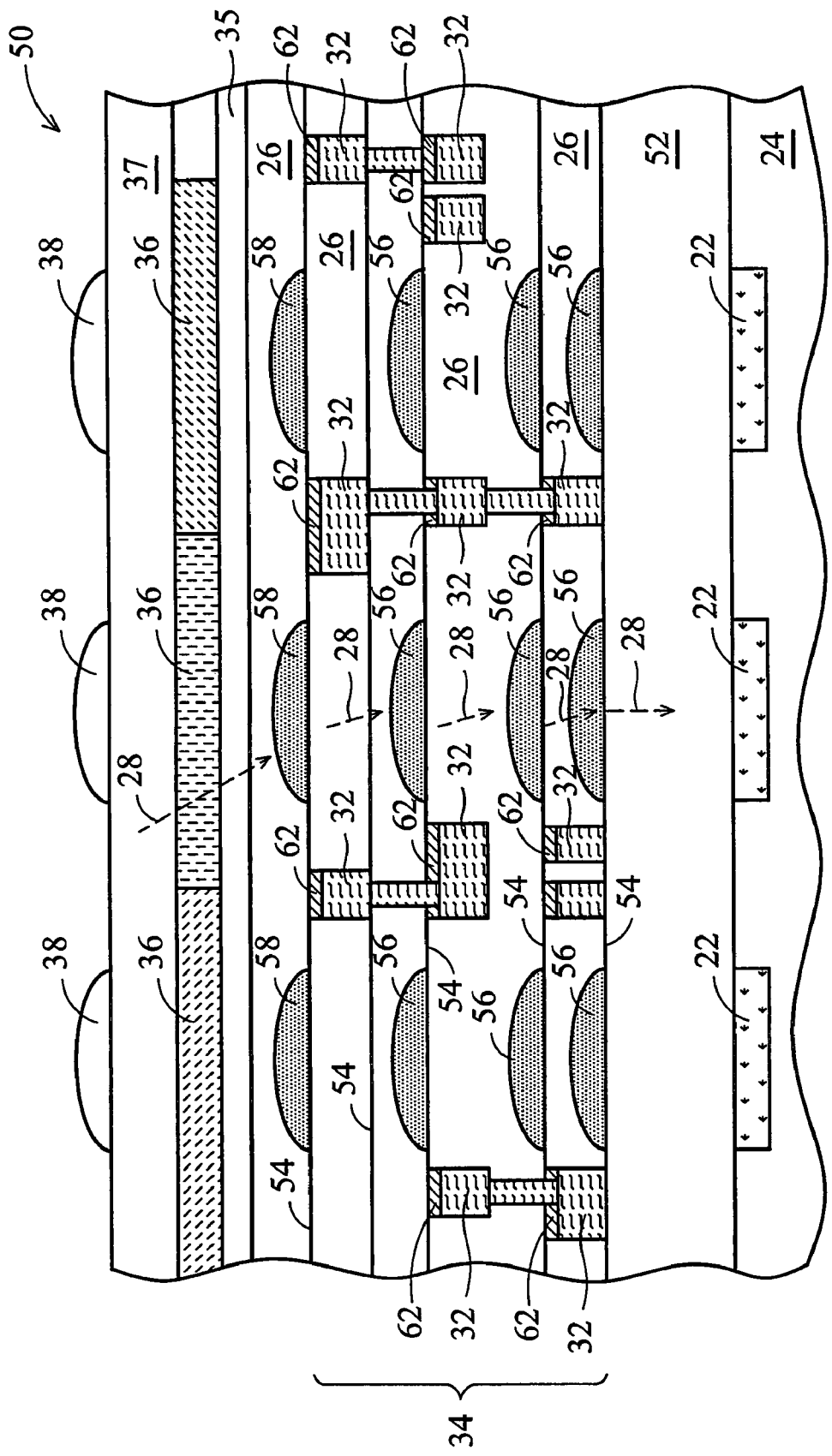
FIG. 6 is a cross-section view showing part of an image sensor device in accordance with a fifth illustrative embodiment of the present invention.

FIG. 6 is a cross-section view showing part of an image sensor device 50 in accordance with a fifth illustrative embodiment of the present invention. The sixth embodiment has multiple levels of micro-lenses 38, 56, 58. As the number of metallization levels increases (e.g., structures with more than three levels of metallization), it may be desirable or necessary to have multiple levels of micro-lenses in accordance with an embodiment of the present invention, e.g., in order to allow pixel sizes to shrink and array density to increase while being compatible with logic embedded devices (e.g., SOC). In the fifth embodiment of FIG. 6, there are three levels of IMD-level micro-lenses 56, one level of micro-lenses 58 above the interconnection structure and an upper-most level of micro-lenses 38. Also, color filters 36 are located between the upper-most micro-lenses 38 and the other micro-lenses 56, 58. This is currently one preferred design for an embodiment having three or more metallization levels.

With reference to FIGS. 6-12, an illustrative method of manufacturing an image sensor device 50 of the sixth embodiment will be described. This method or relevant portions of this method may be applied for manufacturing other embodiments of the present invention as well. As described above, FIG. 6 shows the image sensor device 50 already manufactured. FIGS. 7-12 will sequentially lead up to the structure shown in FIG. 6.

Figure 7:
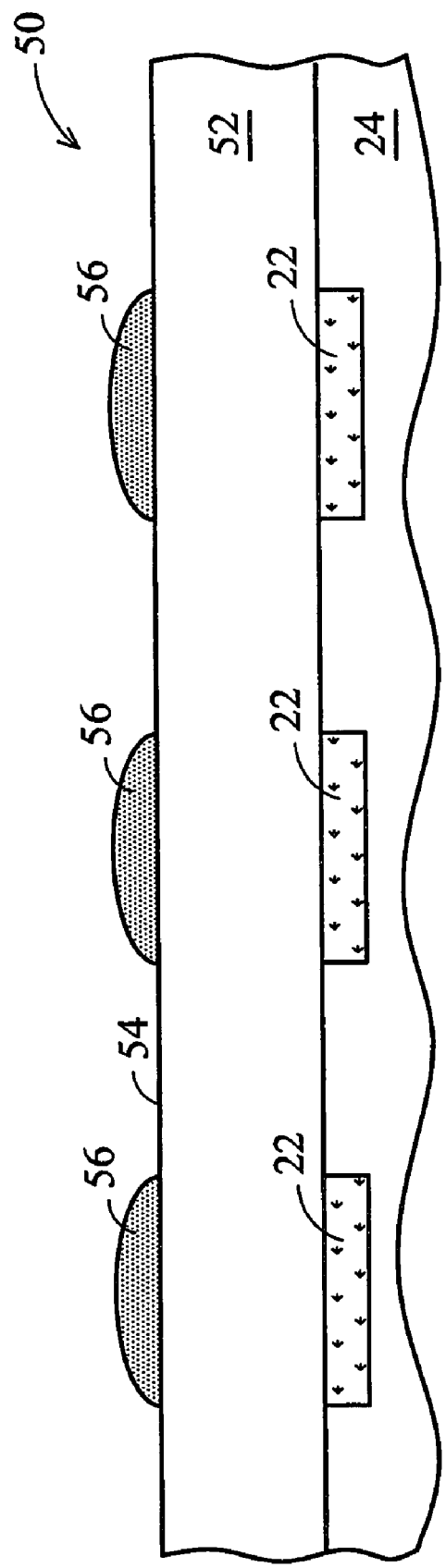
FIGS. 7-12 show steps of an illustrative method of manufacturing the image sensor device of FIG. 6.
Figure 8:
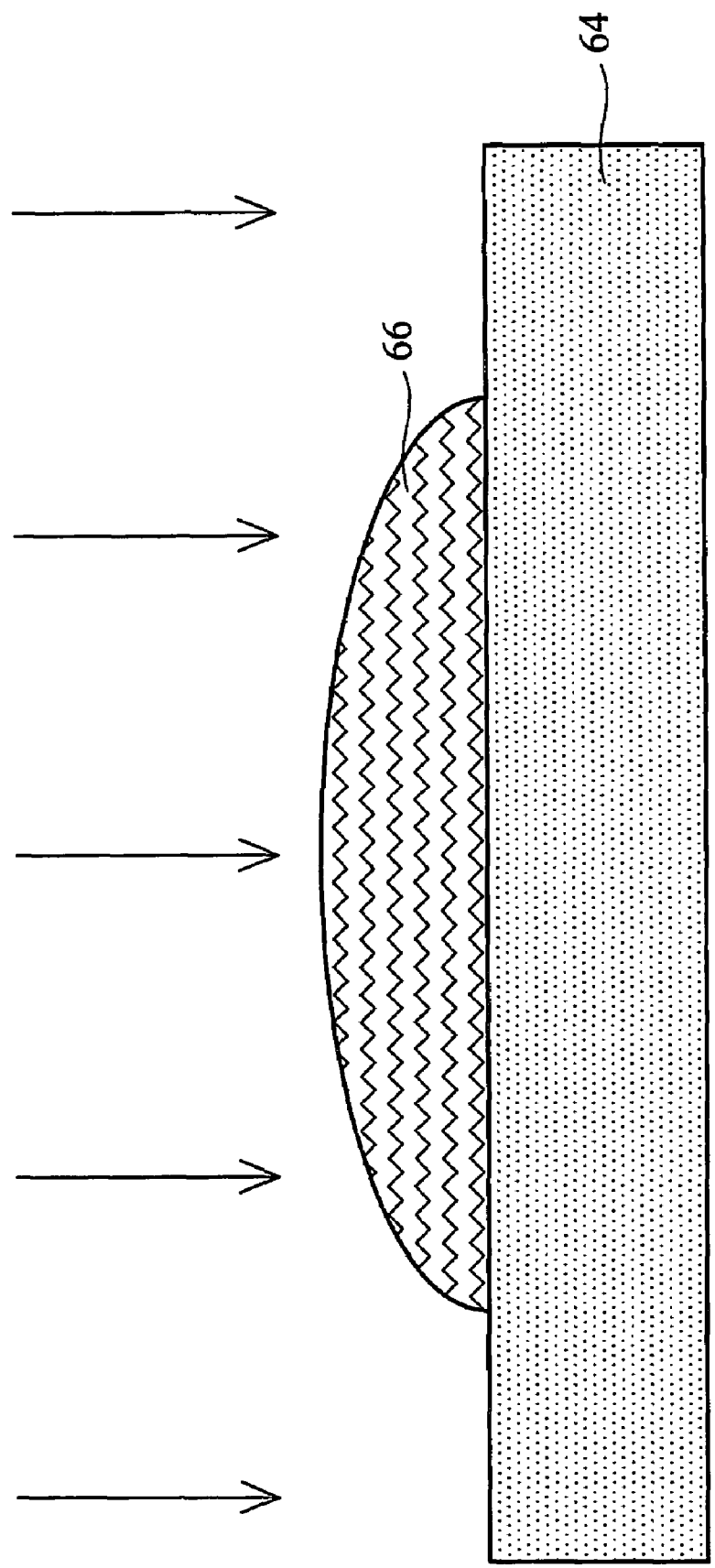
Figure 9:
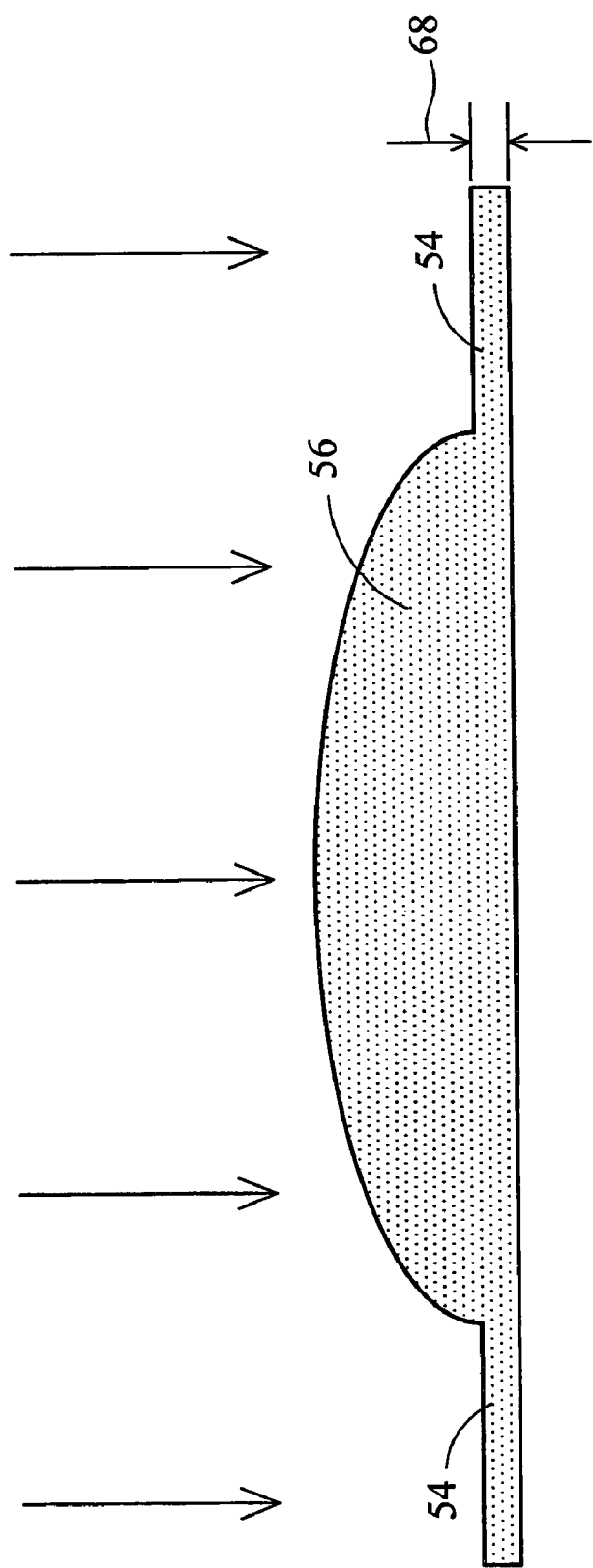

In FIG. 7, a substrate 24 having photosensor regions 22 formed therein is shown. An ILD layer 52 is formed over the substrate 24. A barrier layer 54 and a first level of IMD-level micro-lenses 56 are formed on the ILD layer 52. FIGS. 8-9 illustrate a method of forming a micro-lens (56 and/or 58) from a same material and a same initial layer 64 of barrier layer material, as that used to form the barrier layer 54 at that level. In FIG. 8, an initial layer 64 of barrier layer material is formed over an underlying layer (ILD layer 52 in this example, but could be any layer level). A photoresist layer is formed on the initial layer 64. The photoresist is then patterned and etched to form a lens-shaped photoresist portion 66 on the initial layer 64, as shown in FIG. 8. With the lens-shaped photoresist portion 66 formed, an anisotropic etch (e.g., RIE etch and/or dry etch) is performed. After the etching, the lens-shaped photoresist portion 66 is etched away along with most of the initial layer 64 outside of the lens-shaped region to provide the layer structure shown in FIG. 9. The thickness of the initial layer 64, the size of the lens-shaped photoresist portion 66, and the etching properties (etch chemistry, etch time, and/or etch stop control) may be controlled so that the barrier layer 54 has a net thickness 68 of 100 angstroms or less outside of the micro-lens structures 56. Although it may be preferred to have the micro-lenses (56 and/or 58) formed integrally with the barrier layer 54 as described with respect to FIGS. 8 and 9, in other embodiments of the present invention, the micro-lenses may be formed from a different material than and/or formed from a same material but not integral with that of the barrier layer.

Figure 10:
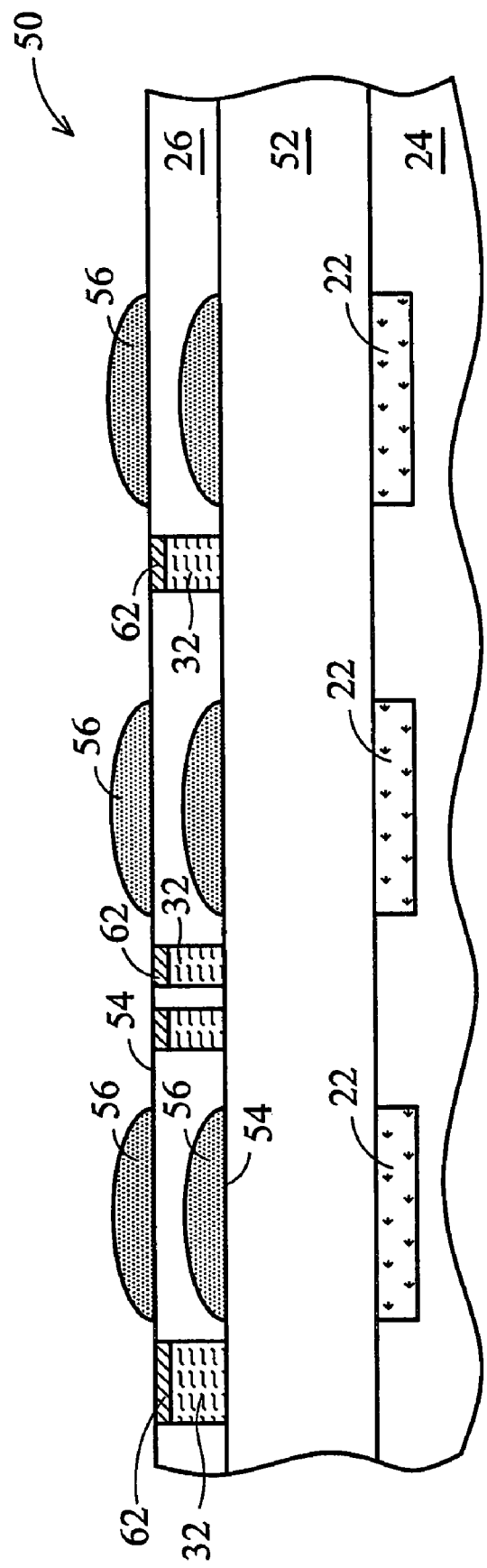
Figure 11:
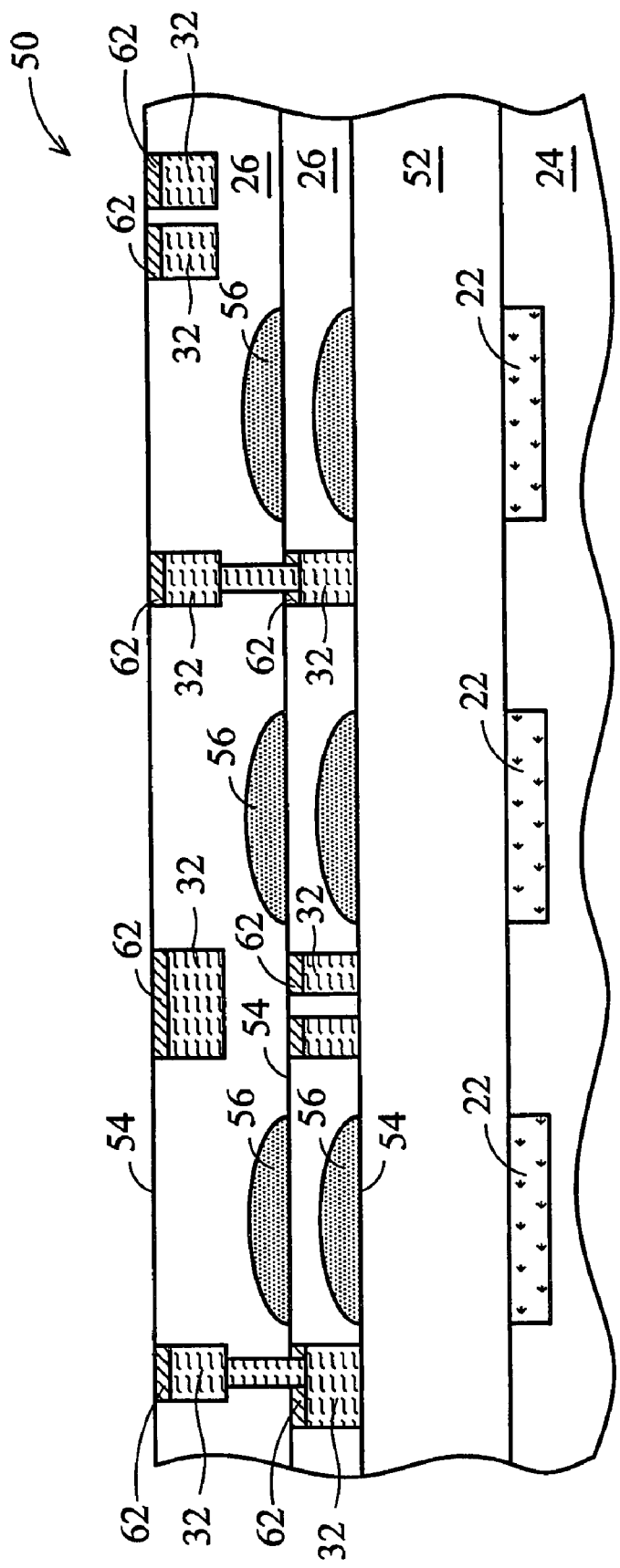
Figure 12:
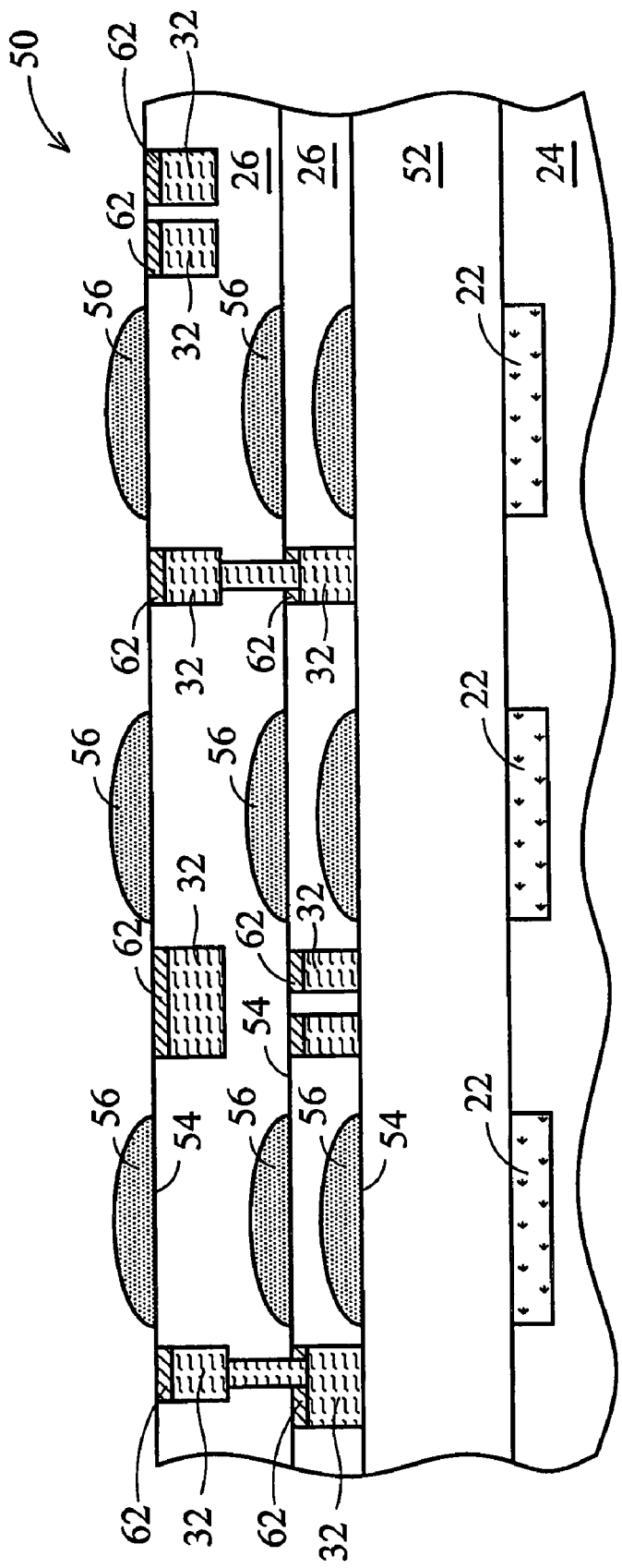

Referring now to FIG. 10, an IMD layer 26 has been formed over the first level of IMD-level micro-lenses 56. Then a damascene process is used to form the copper metal lines 32. A cap layer 62 is formed, patterned, and etched over the metal lines 32 to provide a diffusion barrier layer. Next, another barrier layer 54 with integral IMD-level micro-lenses 56 is formed over the IMD layer 26 and metal lines 32, as shown in FIG. 10. In FIG. 11, more metal lines 32 have been formed using a dual damascene process, along with more cap layers 62 to provide diffusion barriers over the metal lines. In FIG. 12, yet another barrier layer 54 with integral IMD-level micro-lenses 56 is formed over the IMD layer 26 and metal lines 32. This continues until all of the metallization levels of the interconnection structure 34 are formed. Note that not every level needs to have a level of micro-lenses 56 or 58 in other embodiments. The result is the image sensor device 50 shown in FIG. 6.

Figure 13:
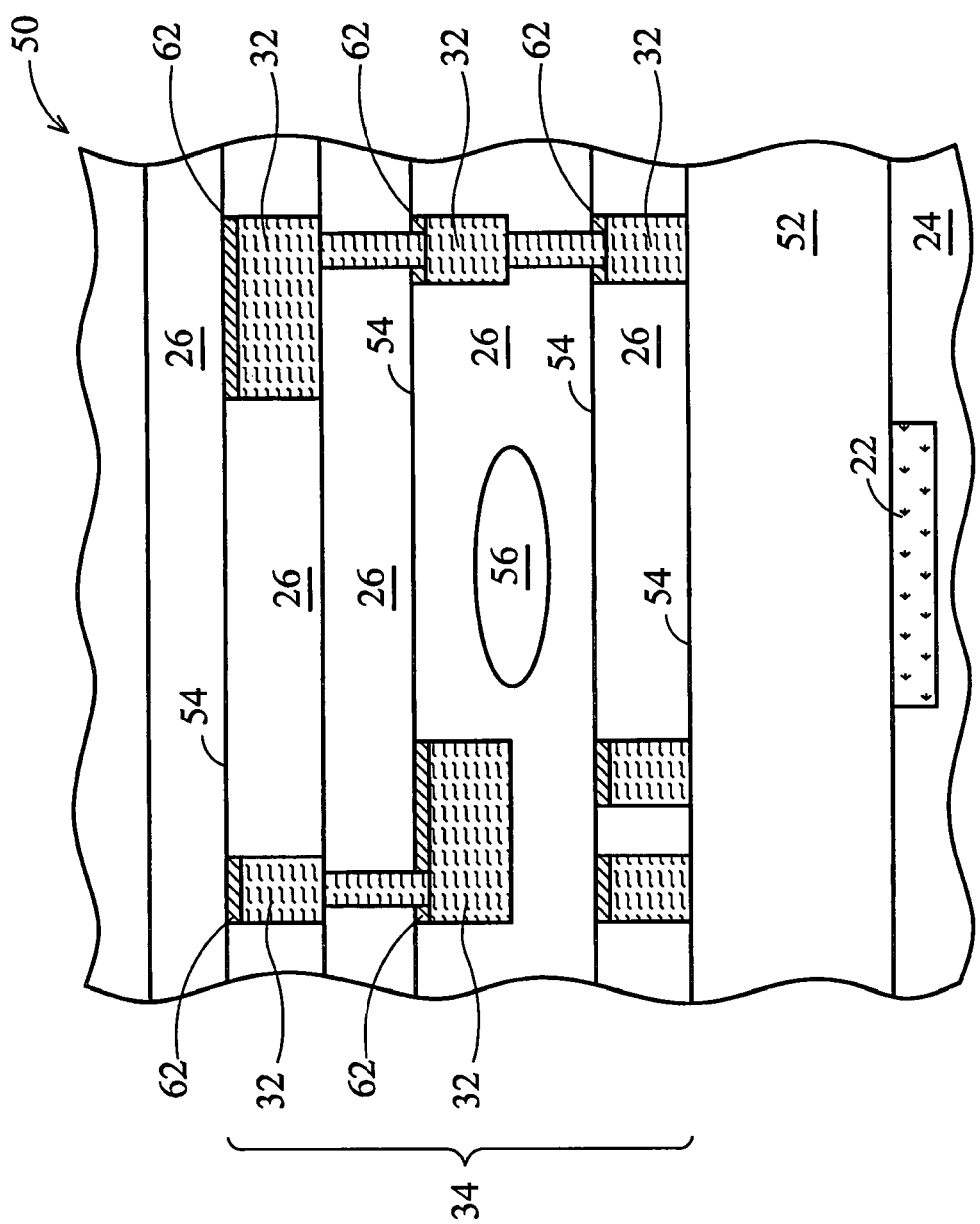
FIGS. 13-18 are partial cross-section views for image sensor devices of some illustrative embodiments of the present invention to illustrate some exemplary micro-lens shapes and structures that may be incorporated into an embodiment of the present invention.
Figure 14:
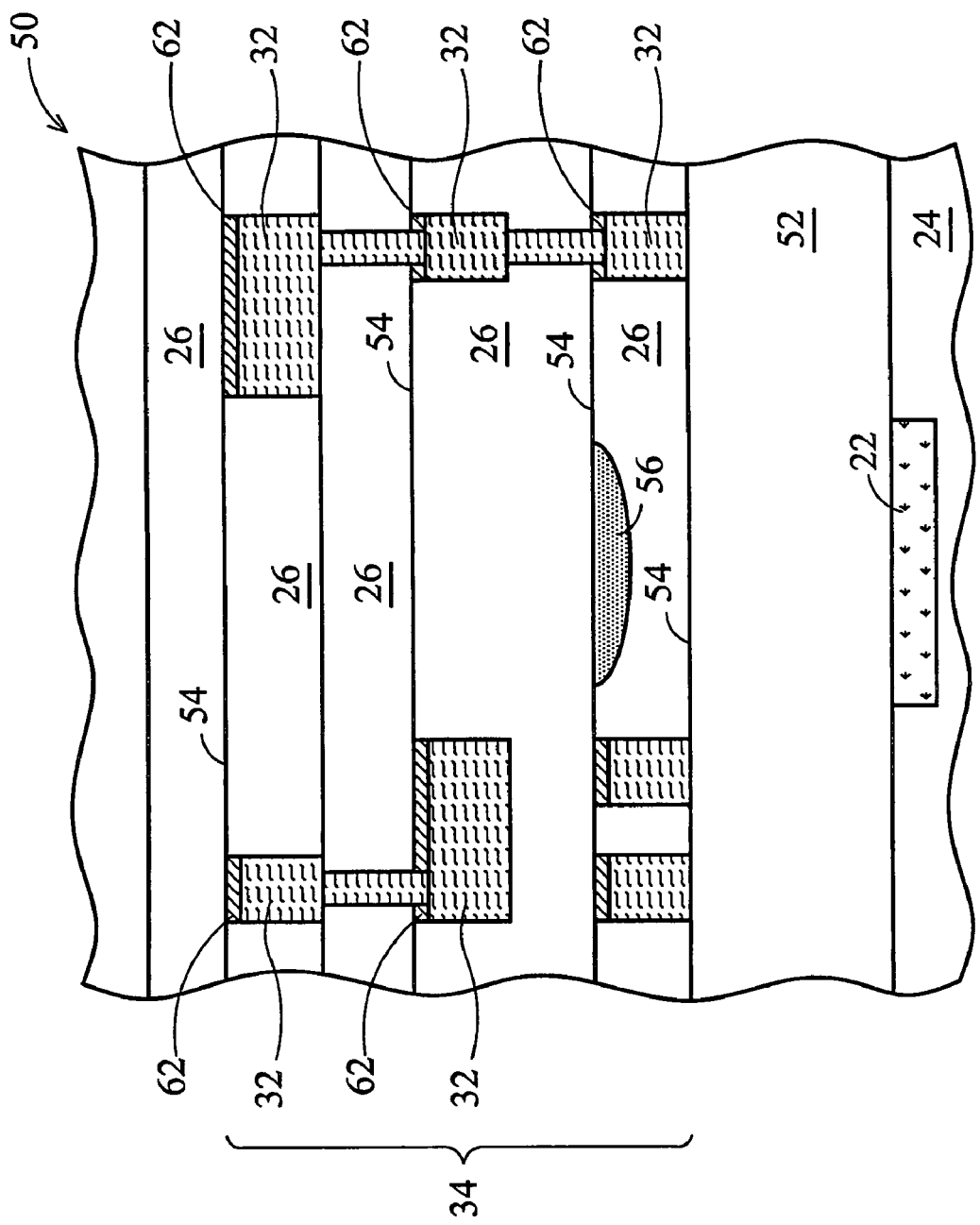
Figure 15:
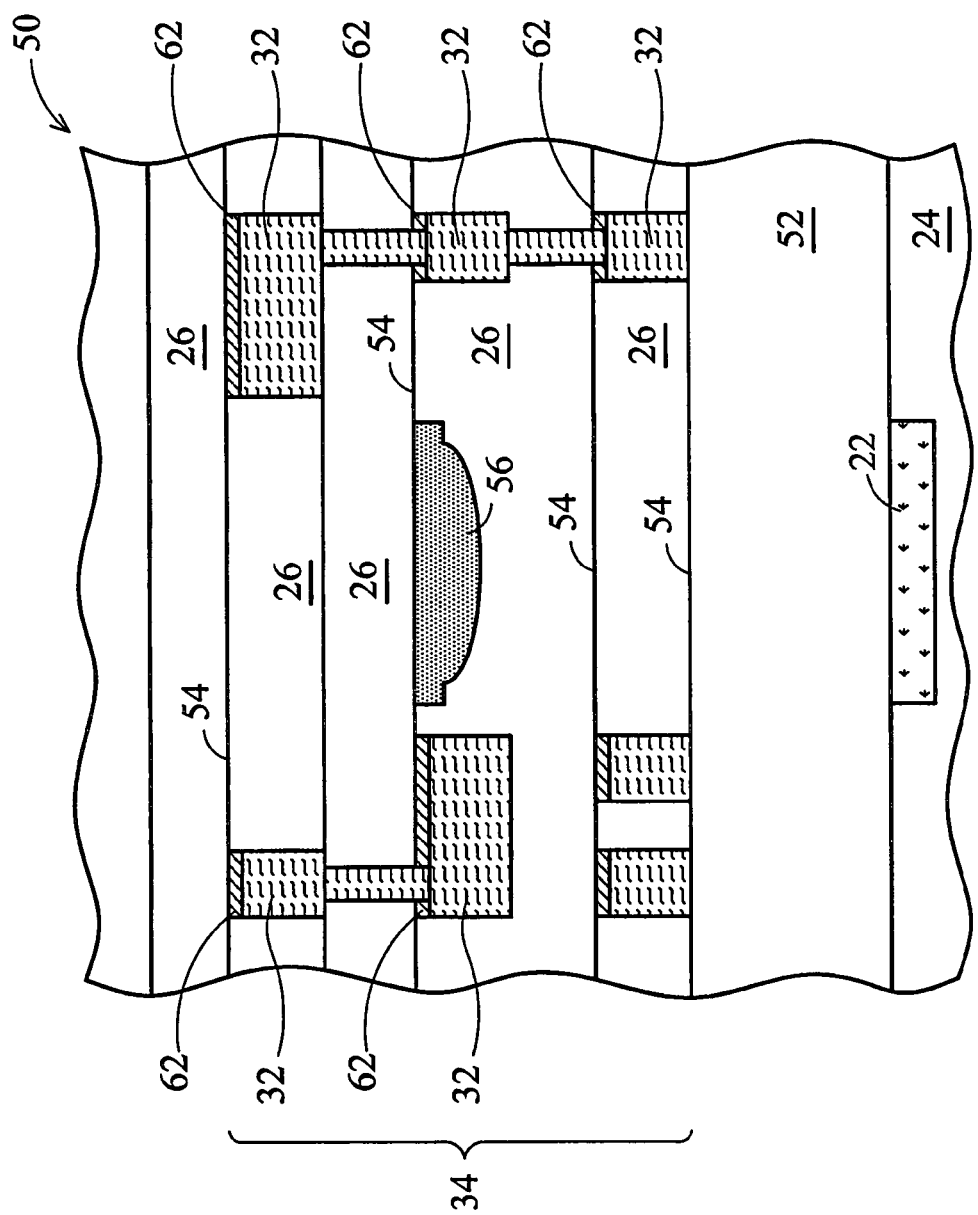
Figure 16:
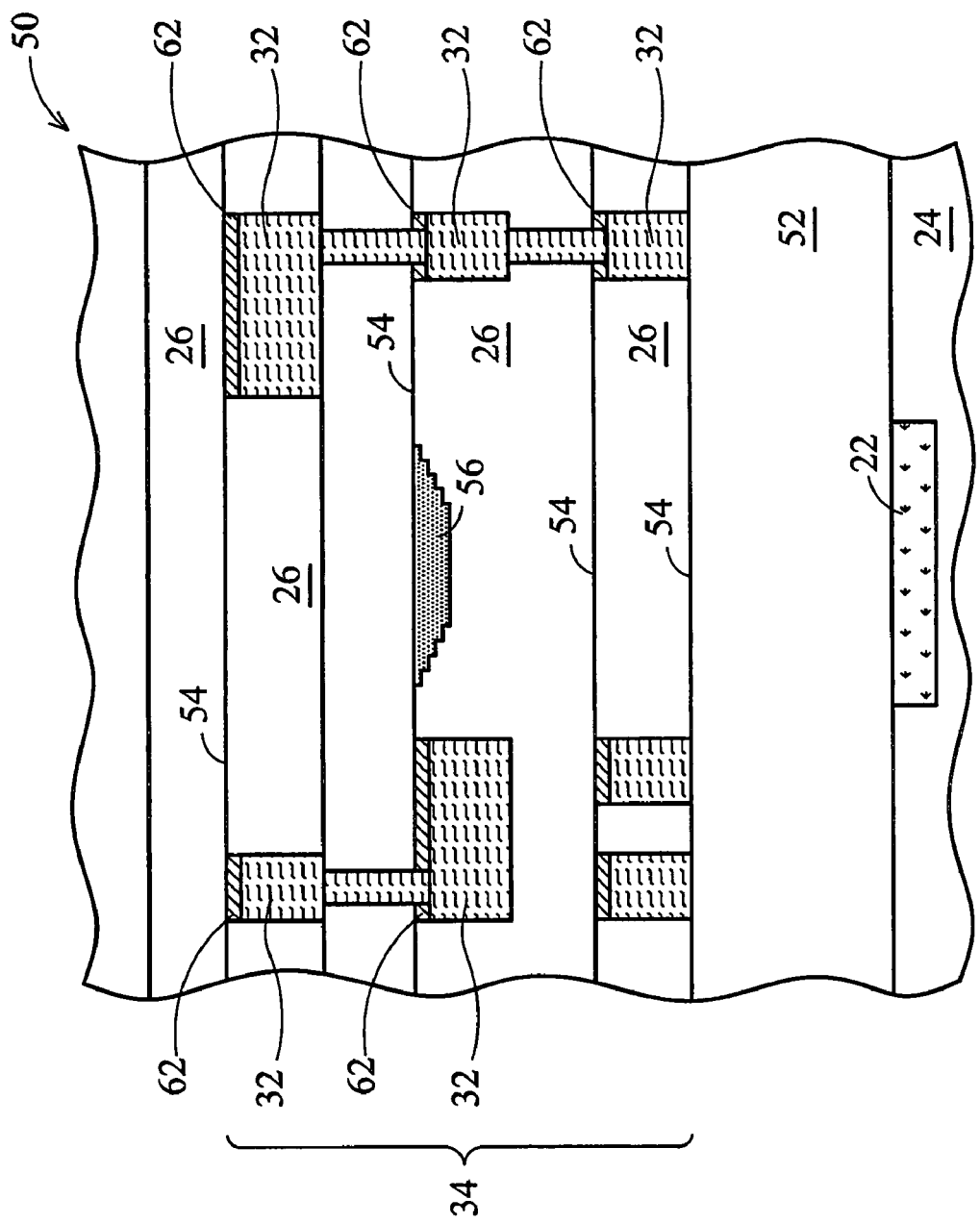
Figure 17:
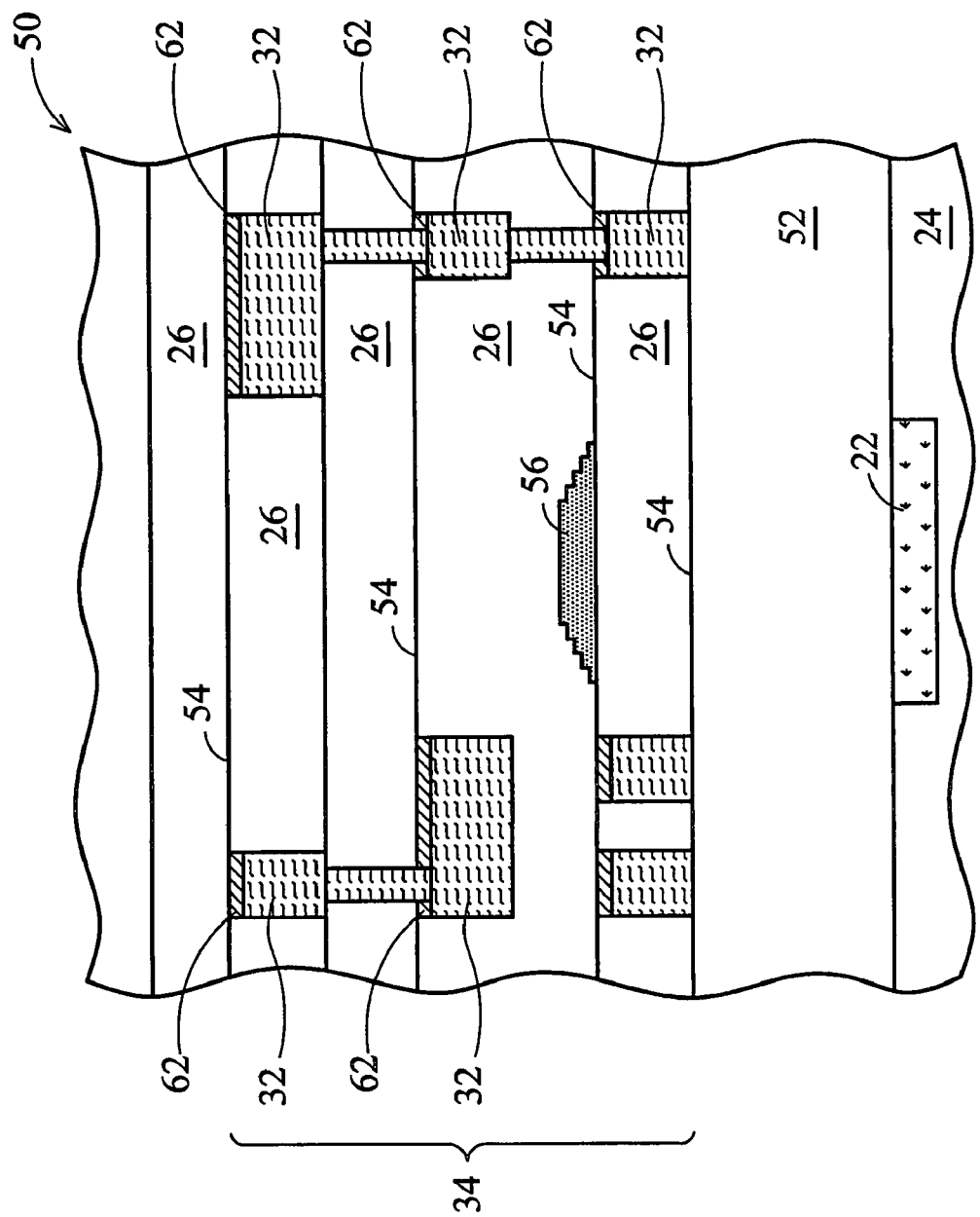
Figure 18:
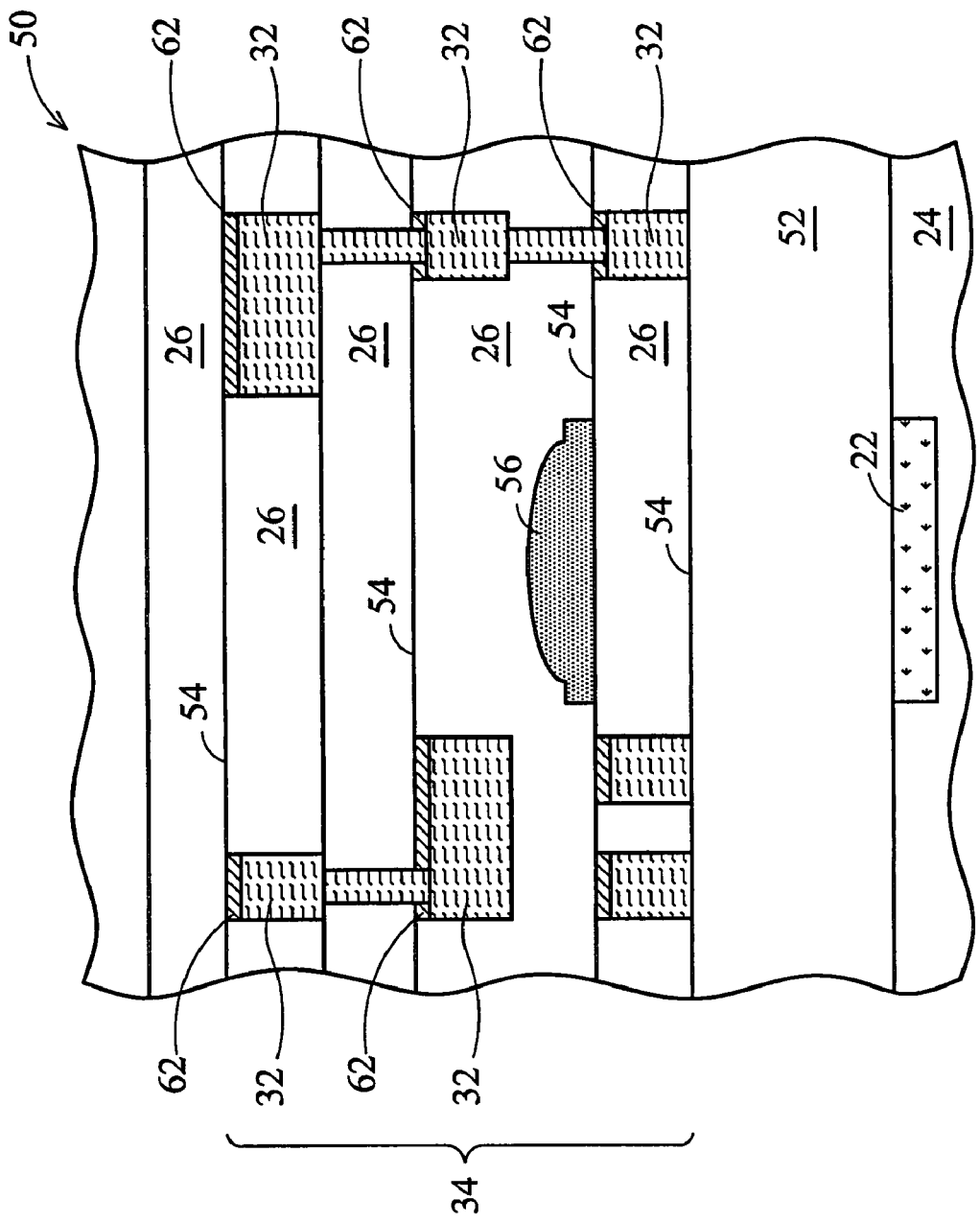

As noted in U.S. Patent Application having Publication Number US 2005/0274968 (by Taiwan Semiconductor Manufacturing Corporation also), a micro-lens (56 and/or 58) may have a variety of shapes. Accordingly, the micro-lenses at any level for an embodiment of the present invention may have any suitable micro-lens shape (currently known or later developed). FIGS. 13-18 are partial cross-section views for image sensor devices 50 of some illustrative embodiments of the present invention. These embodiments illustrate some exemplary micro-lens shapes and structures that may be incorporated into an embodiment of the present invention. In FIG. 13, the IMD-level micro-lens 56 shown has a bi-convex shape and is embedded in an IMD layer 26 between barrier layers 54 (and over the photosensor region 22). In FIG. 14, the IMD-level micro-lens 56 shown has a convex-down shape. In FIG. 15, the IMD-level micro-lens 56 has a convex-down shape with a partial Fresnel lens shape. In FIG. 16, the IMD-level micro-lens 56 has a Fresnel lens shape (convex down). In FIG. 17, the IMD-level micro-lens 56 has a Fresnel lens shape (convex up). In FIG. 18, the IMD-level micro-lens 56 has a convex-up shape with a partial Fresnel lens shape. Any combination of shapes and any number of different shapes may be incorporated into an embodiment of the present invention (e.g., different micro-lens shapes at different levels). Furthermore, the size and focal point of micro-lenses may vary for different levels to provide a desired optical focusing or directing of the light rays entering the image sensor device 50.

Figure 19A:
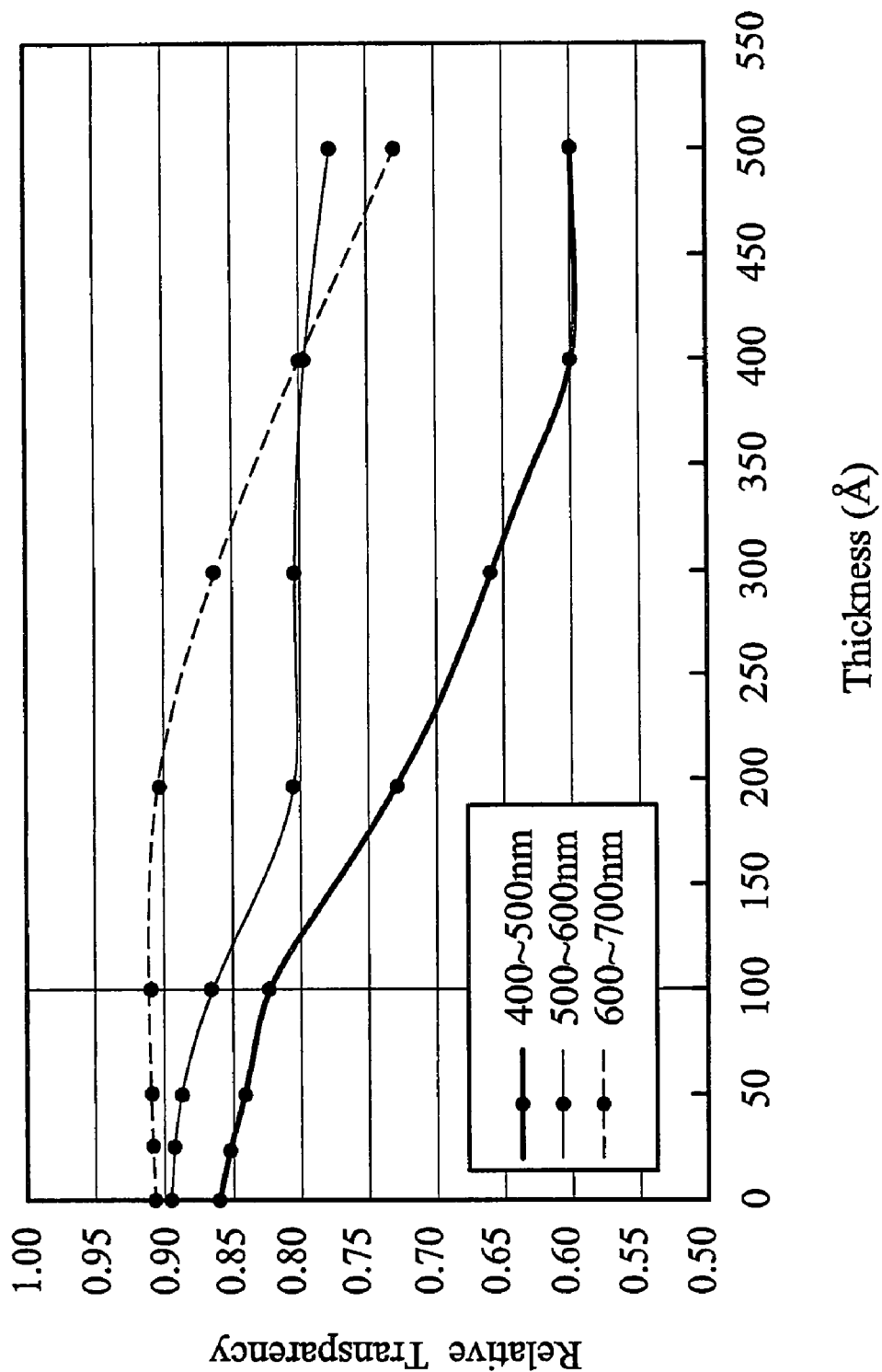
FIGS. 19A and 19B are plots showing some experimental data for barrier layers of different net thicknesses for two exemplary barrier layer materials.
Figure 19B:
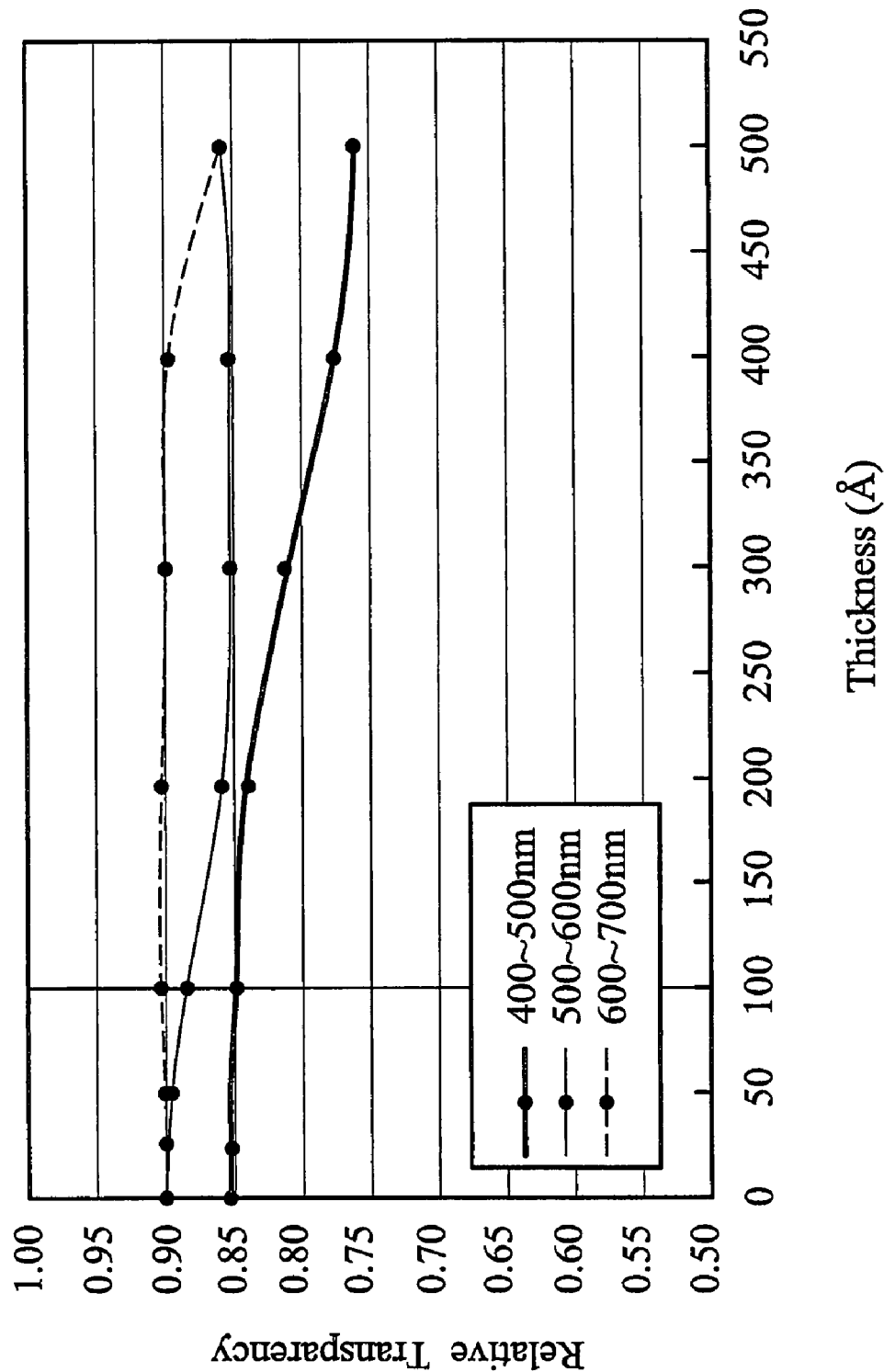

FIGS. 19A and 19B are plots showing some experimental data for barrier layers of different net thicknesses for two exemplary barrier layer materials: SiC (FIG. 19A) and $Al_2O_3$ (FIG. 19B). In each plot of FIGS. 19A and 19B, the vertical axis shows relative transparency and the horizontal axis shows the net thickness of the barrier layer. Note that in both plots for these preferred barrier layer materials, the relative transparency begins to drop after about 100 angstroms net thickness for the three light wavelengths tested (i.e., 400-500 nm, 500-600 nm, and 600-700 nm). Thus, this experimental data shows that an barrier layer made from SiC or $Al_2O_3$, for example, will have no impact on the quantum efficiency or the relative transparency of light at these wavelengths when the net thickness is about 100 angstroms or less.

An embodiment of the present invention may have any of the following advantages and benefits:

Compatible with system-on-chip structures, logic embedded structures, and other structures having three or more levels of metallization in the interconnect structure;

Providing better light transparency and less cross-talk between pixels;

Increasing the incident light that arrives at a photosensor region, even for thicker devices;

No HDP gap filling issues for dense pixels region and/or highly integrated damascene structures (e.g., more than three layers), as compared to other prior art structures, and no extra steps needed for removing barrier layers over the photosensor regions;

Structure design that allows for the use of multiple levels of micro-lenses, which helps focus light to the photosensor regions;

Structure design that is compatible with the use of copper lines and cap layers;

Structure design that is compatible with using low-k dielectric materials;

Structure design that is compatible with all or most all types of photosensors;

Structure design that allows for greater pixel densities;

Integrates easily and efficiently with existing manufacturing methods and tooling already being used; and Integrates easily with manufacturing processes used or desired to be used for forming other devices on the same chip (SoC friendly).

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An image sensor device comprising:
   a substrate having a photosensor region;
   an interconnection structure formed over the substrate, the interconnection structure comprising metal lines formed in inter-metal dielectric (IMD) layers; and
   at least one IMD-level micro-lens formed in at least one of the IMD layers over the photosensor region; and
   a barrier layer having a net thickness limited to 100 angstroms or less located between the IMD layers and above the photosensor region;

wherein the at least one IMD-level micro-lens is formed from a same material and a same initial layer as that of the barrier layer.

2. The image sensor device of claim 1, wherein the at least one IMD-level micro-lens has a refractive index greater than that of the at least one of the IMD layers in which the at least one IMD-level micro-lens is formed.

3. The image sensor device of claim 1, further comprising a cap layer formed on the metal lines, and wherein at least some of the metal lines comprise copper.

4. The image sensor device of claim 3, wherein the cap layer comprises a cap layer material selected from the group consisting of conductive material, metal nitride, CoWP, CoWB, metal silicide, and combinations thereof.

5. The image sensor device of claim 1, wherein the at least one IMD-level micro-lens comprises a lens material selected from the group consisting of a metal oxide, aluminum oxide, hafnium oxide, zirconium oxide, a nitrogen containing material, a carbon containing material, and combinations thereof.

6. The image sensor device of claim 1, wherein the barrier layer comprises a barrier layer material selected from the group consisting of a metal oxide, aluminum oxide, hafnium oxide, zirconium oxide, a nitrogen containing material, a carbon containing material, and combinations thereof.

7. The image sensor device of claim 1, further comprising a color filter over the photosensor region, wherein the at least one IMD-level micro-lens is located between the photosensor region and the color filter.

8. The image sensor device of claim 1, further comprising an upper-level micro-lens located over the photosensor region and located on a level that is above the interconnection structure.

9. The image sensor device of claim 8, further comprising a color filter located over the photosensor region, and located between the upper-level micro-lens and the at least one IMD-level micro-lens.

10. A system-on-chip semiconductor structure comprising the image sensor device of claim 1, the system-on-chip semiconductor structure further comprising a logic circuit electrically connected to at least part of the image sensor device.

11. An image sensor device comprising:
a substrate having a photosensor region formed therein and/or thereon;
an interconnection structure formed over the substrate, the interconnection structure comprising metal lines formed in inter-metal dielectric (IMD) layers, wherein at least some of the metal lines comprise copper;
a barrier layer located between the IMD layers, at locations over the photosensor region;
at least one IMD-level micro-lens formed in at least one of the IMD layers over the photosensor region, wherein the at least one IMD-level micro-lens and the barrier layer are formed from a same material and a same initial layer;
an upper-level micro-lens located over the photosensor region and located on a level that is above the interconnection structure; and
a cap layer formed on the metal lines that comprise copper, the cap layer comprising a material selected from the group consisting of conductive material, metal nitride, CoWP, CoWB, metal silicide, and combinations thereof.

12. The image sensor device of claim 11, wherein the at least one IMD-level micro-lens comprises a lens material selected from the group consisting of a dielectric material, a metal oxide, aluminum oxide, hafnium oxide, zirconium oxide, a nitrogen containing material, a carbon containing material, an oxygen containing material, and combinations thereof.

13. The image sensor device of claim 12, wherein the thickness of the barrier layer is limited to 100 angstroms or less at locations over the photosensor region, except at locations where any of the at least one IMD-level micro-lens is located.

14. The image sensor device of claim 11, wherein the interconnection structure has at least three levels of the metal lines.

15. The image sensor device of claim 11, further comprising a color filter located over the photosensor region.

16. A system-on-chip apparatus comprising:
an image sensor portion of a semiconductor substrate having a photosensor region formed therein and/or thereon;
an interconnection structure formed over the substrate, the interconnection structure comprising metal lines formed in inter-metal dielectric (IMD) layers, wherein at least some of the metal lines comprise copper;
a barrier layer having a net thickness limited to 100 angstroms or less located between the IMD layers, at locations over the photosensor region;
at least one IMD-level micro-lens formed in at least one of the IMD layers over the photosensor region, wherein the at least one IMD-level micro-lens comprises a lens material selected from the group consisting of a dielectric material, a metal oxide, aluminum oxide, hafnium oxide, zirconium oxide, a nitrogen containing material, a carbon containing material, an oxygen containing material, and combinations thereof, the at least one IMD-level micro-lens and the barrier layer formed from a same material and a same initial layer;
an upper-level micro-lens located over the photosensor region and located on a level that is above the interconnection structure; and
logic circuitry formed in another portion of the semiconductor substrate operationally coupled to the image sensor.

17. An image sensor device comprising:
a substrate having a photosensor region;
an interconnection structure formed over the substrate, the interconnection structure comprising metal lines formed in inter-metal dielectric (IMD) layers;
at least one IMD-level micro-lens formed in at least one of the IMD layers over the photosensor region; and
a barrier layer located between the IMD layers and above the photosensor region;
wherein the at least one IMD-level micro-lens is formed from a same material and a same initial layer as that of the barrier layer.

18. The image sensor device of claim 17, wherein the at least one IMD-level micro-lens comprises a lens material selected from the group consisting of a metal oxide, aluminum oxide, hafnium oxide, zirconium oxide, a nitrogen containing material, a carbon containing material, and combinations thereof.

19. The image sensor device of claim 17, wherein the barrier layer comprises a barrier layer material selected from the group consisting of a metal oxide, aluminum oxide, hafnium oxide, zirconium oxide, a nitrogen containing material, a carbon containing material, and combinations thereof.

20. The image sensor device of claim 17, wherein the thickness of the barrier layer is limited to 100 angstroms or less at locations over the photosensor region, except at locations where any of the at least one IMD-level micro-lens is located.

21. The image sensor device of claim 17, and further comprising an upper-level micro-lens located over the photosensor region and located on a level that is above the interconnection structure.

22. The image sensor device of claim 17 and further comprising a cap layer formed on the metal lines, comprising a cap layer material selected from the group consisting of conductive material, metal nitride, CoWP, CoWB, metal silicide, and combinations thereof.

* * * * *

UNITED STATES PATENT AND TRADEMARK OFFICE
CERTIFICATE OF CORRECTION

PATENT NO. : 7,544,982 B2  Page 1 of 1
APPLICATION NO. : 11/542064
DATED : June 9, 2009
INVENTOR(S) : Yu et al.

It is certified that error appears in the above-identified patent and that said Letters Patent is hereby corrected as shown below:

On the Title Page, Item (54), delete "Methods" and insert --Method--.
In Col. 1, line 3, delete "Methods" and insert --Method--.

Signed and Sealed this

Twenty-first Day of July, 2009

JOHN DOLL
*Acting Director of the United States Patent and Trademark Office*